US012653043B2

(12) United States Patent
Choi et al.

(10) Patent No.: US 12,653,043 B2
(45) Date of Patent: Jun. 9, 2026

(54) SEMICONDUCTOR PACKAGE INCLUDING HEAT DISSIPATION STRUCTURE

(71) Applicant: Samsung Electronics Co., Ltd., Suwon-si (KR)

(72) Inventors: Juil Choi, Suwon-si (KR); Jusuk Kang, Suwon-si (KR); Hyungjun Park, Suwon-si (KR); Sanghyuck Oh, Suwon-si (KR); Hyunju Lee, Suwon-si (KR); Sangyeol Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 633 days.

(21) Appl. No.: 18/095,642

(22) Filed: Jan. 11, 2023

(65) Prior Publication Data

US 2023/0361046 A1    Nov. 9, 2023

(30) Foreign Application Priority Data

May 6, 2022    (KR) ........................ 10-2022-0056245

(51) Int. Cl.
| | |
|---|---|
| *H01L 23/495* | (2006.01) |
| *H10B 80/00* | (2023.01) |
| *H10W 70/60* | (2026.01) |
| *H10W 70/685* | (2026.01) |
| *H10W 74/10* | (2026.01) |
| *H10W 90/00* | (2026.01) |

(52) U.S. Cl.
CPC .......... *H10W 70/611* (2026.01); *H10B 80/00* (2023.02); *H10W 70/685* (2026.01); *H10W 74/117* (2026.01); *H10W 90/701* (2026.01)

(58) Field of Classification Search
CPC ............. H01L 23/5383; H01L 23/3128; H01L 23/49816; H01L 23/36; H01L 25/0652; H01L 25/18; H01L 21/568; H01L 2221/68359; H01L 2224/81; H01L 2225/1023; H01L 2225/1035; H01L 2225/1041; H01L 2225/1094; H01L 23/5389; H01L 25/105; H01L 23/49822; H01L 21/60
USPC ...................................................... 257/668
See application file for complete search history.

(56) References Cited

U.S. PATENT DOCUMENTS

| | | | |
|---|---|---|---|
| 7,220,657 | B2 | 5/2007 | Ihara et al. |
| 7,615,415 | B2 | 11/2009 | Kwon et al. |
| 8,158,508 | B2 | 4/2012 | Lin et al. |
| 8,975,726 | B2 | 3/2015 | Chen et al. |
| 9,583,472 | B2 | 2/2017 | Chung et al. |

(Continued)

FOREIGN PATENT DOCUMENTS

KR    10-0809693 B1    3/2008

*Primary Examiner* — Theresa T Doan
(74) *Attorney, Agent, or Firm* — Muir Patent Law, PLLC

(57) ABSTRACT

Provided are a semiconductor package having a structure maximizing heat dissipation efficiency and a method of manufacturing the same. The semiconductor package includes a first redistribution substrate, a first semiconductor chip on the first redistribution substrate, a plurality of through posts on the first redistribution substrate, around the first semiconductor chip, and a second redistribution substrate located over the first semiconductor chip and the through posts, wherein a top surface of the first semiconductor chip is in contact with a bottom surface of the second redistribution substrate.

16 Claims, 30 Drawing Sheets

(56) References Cited

U.S. PATENT DOCUMENTS

| | | | | |
|---|---|---|---|---|
| 9,633,974 | B2 | 4/2017 | Zhai et al. | |
| 9,859,265 | B2 | 1/2018 | Liu et al. | |
| 10,269,619 | B2 | 4/2019 | Yu et al. | |
| 10,879,162 | B2 | 12/2020 | Jeng et al. | |
| 2014/0103488 | A1* | 4/2014 | Chen | H01L 24/19 |
| | | | | 257/532 |
| 2018/0277394 | A1* | 9/2018 | Huemoeller | H01L 21/565 |
| 2021/0202396 | A1* | 7/2021 | Wu | H01L 23/5383 |

* cited by examiner 135
114 ⎱
112 ⎰ 110
600

134 ⎫
   ⎬ 130
132 ⎭

120
125
135a
114 ⎫
   ⎬ 110
112 ⎭

600

SEMICONDUCTOR PACKAGE INCLUDING HEAT DISSIPATION STRUCTURE

CROSS-REFERENCE TO RELATED APPLICATION

This application is based on and claims priority under 35 U.S.C. § 119 to Korean Patent Application No. 10-2022-0056245, filed on May 6, 2022, in the Korean Intellectual Property Office, the disclosure of which is incorporated by reference herein in its entirety.

BACKGROUND

The inventive concept relates to a semiconductor package, and more particularly, to a semiconductor package including a redistribution substrate on and under a semiconductor chip, and a method of manufacturing the semiconductor package.

Due to the rapid development of the electronics industry and demands of users, electronic devices are becoming smaller and lighter. As electronic devices are becoming smaller and lighter, semiconductor packages used therein are also becoming smaller and lighter, and such a semiconductor package is required to have high reliability, high performance, and large capacity. As such a semiconductor package has high performance and high capacity, power consumption of semiconductor packages is increasing. Therefore, the importance of the structure of a semiconductor package is increasing in response to the size/performance of semiconductor packages and for stably supplying power to semiconductor packages.

SUMMARY

The inventive concept provides a semiconductor package having a structure maximizing heat dissipation efficiency and a method of manufacturing the same.

In addition, the technical goals to be achieved by the inventive concept are not limited to the technical goals mentioned above, and other technical goals may be clearly understood by one of ordinary skill in the art from the following descriptions.

According to an aspect of the inventive concept, there is provided a semiconductor package including a first redistribution substrate, a first semiconductor chip on the first redistribution substrate, a plurality of through posts arranged on the first redistribution substrate around the first semiconductor chip, and a second redistribution substrate located over the first semiconductor chip and the through posts, wherein a top surface of the first semiconductor chip is in contact with a bottom surface of the second redistribution substrate.

According to another aspect of the inventive concept, there is provided a semiconductor package including a first redistribution substrate, a semiconductor chip on the first redistribution substrate, a plurality of through posts arranged on the first redistribution substrate around the semiconductor chip, a second redistribution substrate located over the semiconductor chip and the through posts, a sealing member located between the first redistribution substrate and the second redistribution substrate and sealing the semiconductor chip, and external connection terminals arranged in a fan-out (FO) structure on a bottom surface of the first redistribution substrate, wherein a top surface of the semiconductor chip contacts a bottom surface of the second redistribution substrate, and the through posts each include at least two metal layers.

According to another aspect of the inventive concept, there is provided a semiconductor package including a first redistribution substrate, a first semiconductor chip on the first redistribution substrate, a plurality of through posts arranged on the first redistribution substrate around the first semiconductor chip, a second redistribution substrate located over the first semiconductor chip and the through posts, at least one second semiconductor chip on the second redistribution substrate, and external connection terminals arranged in an FO structure on a bottom surface of the first redistribution substrate, wherein a top surface of the first semiconductor chip is in contact with a bottom surface of the second redistribution substrate.

According to another aspect of the inventive concept, there is provided a method of manufacturing a semiconductor package, the method including forming a first redistribution substrate on a carrier substrate, forming a plurality of through posts on an outer portion of the first redistribution substrate, mounting a first semiconductor chip on a central portion of the first redistribution substrate, forming a sealing member covering the through posts and the first semiconductor chip, exposing top surfaces of the through posts and the first semiconductor chip by grinding an upper portion of the sealing member, and forming a second redistribution substrate over the through posts and the first semiconductor chip, wherein a top surface of the first semiconductor chip contacts a bottom surface of the second redistribution substrate, and the through posts each include at least two metal layers.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
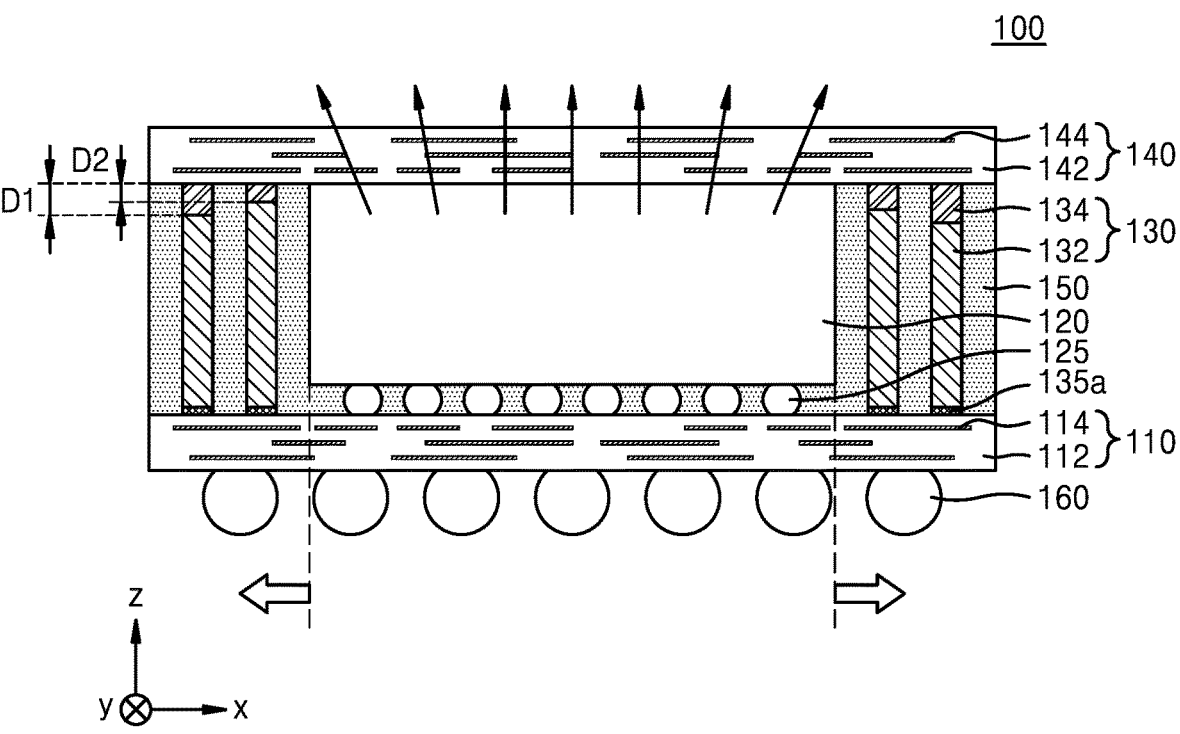
FIG. 1 is a schematic cross-sectional view of a semiconductor package according to an embodiment.

FIG. 1 is a schematic cross-sectional view of a semiconductor package according to an embodiment.

Referring to FIG. 1, a semiconductor package 100 according to the present embodiment may include a first redistribution substrate 110, a first semiconductor chip 120, through posts 130, and a second redistribution substrate 140, a sealing member 150, and first external connection terminals 160.

The first redistribution substrate 110 may be under the first semiconductor chip 120 and may redistribute chip pads of the first semiconductor chip 120 to a region outside the first semiconductor chip 120, e.g., in a plan view. For example, the first redistribution substrate 110 may include a first body insulation layer 112 and first redistribution lines 114. The first redistribution lines 114 may include multiple layers of redistribution lines and may be electrically connected to one another through vias.

As used herein, components described as being "electrically connected" are configured such that an electrical signal can be transferred from one component to the other (although such electrical signal may be attenuated in strength as it transferred and may be selectively transferred).

The first body insulation layer 112 may include an insulation material, e.g., a photo imageable dielectric (PID) resin, and may further include an inorganic filler. However, materials constituting the first body insulation layer 112 are not limited to the above-described materials. The first body insulation layer 112 may have a multiple layer structure corresponding/according to the multiple layer structure of the first redistribution lines 114. However, in FIG. 1, for convenience of explanation, the first body insulation layer 112 is shown as a single layer structure. When the first body insulation layer 112 has a multiple layer structure, multiple layers of the first body insulation layer 112 may include or be formed of the same one material or may include or be formed of different materials from one another.

The first external connection terminals 160 may be arranged on the bottom surface of the first body insulation layer 112. The first external connection terminals 160 may be arranged on external connection pads formed on the bottom surface of the first body insulation layer 112. The first external connection terminals 160 may be electrically connected to the chip pads of the first semiconductor chip 120 through the first redistribution lines 114 of the first redistribution substrate 110 and bumps 125.

As indicated by the bold arrow in FIG. 1, the first external connection terminals 160 may be arranged on a portion corresponding to, e.g., vertically overlapping, the bottom surface of the semiconductor chip 120 (inside the dotted lines) and a portion extending outwardly from, e.g., vertically non-overlapping, the bottom surface of the semiconductor chip 120 in a first direction (x direction) and a second direction (y direction) (outside the dotted lines). As a result, the first redistribution substrate 110 may serve to rearrange the chip pads or the bumps 125 of the first semiconductor chip 120 to a portion larger than the first semiconductor chip 120 through the first redistribution lines 114 and the external connection pads or the first external connection terminals 160. As such, a package structure in which the first external connection terminals 160 are widely provided beyond, e.g., wider than, the bottom surface of the first semiconductor chip 120 is referred to as a fan-out (FO) package structure or a fan-out (FO) structure. On the other hand, a package structure in which the first external connection terminals 160 are provided only in a portion corresponding to the bottom surface of the first semiconductor chip 120 is referred to as a fan-in (FI) package structure.

The first semiconductor chip 120 may be mounted on the first redistribution substrate 110 in a flip-chip structure through the bumps 125. As shown in FIG. 1, the first semiconductor chip 120 may be disposed in a central portion of the first redistribution substrate 110 in the first direction (x-direction). Also, the first semiconductor chip 120 may be disposed in the central portion of the first redistribution substrate 110 in the second direction (y-direction).

The first semiconductor chip 120 may include or may be a logic semiconductor chip. For example, the logic semiconductor chip may include or may be an application processor (AP), a micro-processor, a central processing unit (CPU), a controller, or an application specific integrated circuit (ASIC). The first semiconductor chip 120 may constitute a GPU chip, a CPU chip, an SOC chip, etc., and, depending on the type of the first semiconductor chip 120, the semiconductor package 100 may be classified as a server-oriented semiconductor device or a mobile-oriented semiconductor device. However, the first semiconductor chip 120 is not limited to a logic semiconductor chip. For example, according to some embodiments, the first semiconductor chip 120 may be a memory semiconductor chip.

As the first semiconductor chip 120 is mounted on the first redistribution substrate 110 in a flip-chip structure, the bottom surface of the first semiconductor chip 120 may be an active surface, and the top surface of the first semiconductor chip 120 opposite to the bottom surface may be an inactive surface. Also, the chip pads may be arranged on the bottom surface of the first semiconductor chip 120, and the bumps 125 may be disposed on the chip pads. The chip pads 122 may be electrically connected to other components in the first semiconductor chip 120, e.g., an integrated circuit. For example, multiple wiring layers may be provided on the bottom surface of the semiconductor chip 120, and the chip pads may be electrically connected to an internal integrated circuit in the first semiconductor chip 120 through the multiple wiring layers.

As shown in FIG. 1, the top surface of the first semiconductor chip 120 may contact the bottom surface of the second redistribution substrate 140. For example, the sealing member 150 may not be provided between the first semiconductor chip 120 and the second redistribution substrate 140. In the semiconductor package 100 of the present embodiment, since the top surface of the first semiconductor chip 120 contacts the bottom surface of the second redistribution substrate 140, the heat dissipation effect of the first semiconductor chip 120 may be maximized. The heat dissipation efficiency of a semiconductor package according to the arrangement relationship between a first semiconductor chip and a second redistribution substrate will be described later in more detail with reference to FIGS. 2A and 2B.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The through posts 130 may be arranged between the first redistribution substrate 110 and the second redistribution substrate 140. As the sealing member 150 is disposed between the first redistribution substrate 110 and the second redistribution substrate 140, the through posts 130 may extend through the sealing member 150. The through posts 130 may electrically connect the first redistribution substrate 110 and the second redistribution substrate 140 to each other. For example, the through posts 130 may be electrically connected to second redistribution lines 144 of the second redistribution substrate 140 through first contact vias (refer to 146 of FIG. 3B). Also, the through posts 130 may be electrically connected to the first redistribution lines 114 of the first redistribution substrate 110.

Seed metals 135a may be formed on the first redistribution substrate 110, and the through posts 130 may be formed on the seed metals 135a. A seed metal 135a may include or be formed of one or more of various metal materials like copper (Cu), titanium (Ti), tantalum (Ta), titanium nitride (TiN), and tantalum nitride (TaN). In the semiconductor package 100 of the present embodiment, the seed metal 135a may be included as a portion of a through post 130. For example, when the seed metal 135a includes or is formed of Cu and a lower metal layer 132 of the through post 130 also includes or is formed of Cu, the seed metal 135a may not be distinguished from the lower metal layer 132 and may be included as a portion of the lower metal layer 132. For example, the seed metals 135a may be formed as seed metal layers. For example, the seed metals 135a may be seed metal layers 135a.

The through post 130 may include at least two metal layers. For example, the through post 130 may include the lower metal layer 132 and an upper metal layer 134. In the semiconductor package 100 of the present embodiment, the lower metal layer 132 may include or be formed of Cu, and the upper metal layer 134 may include or be formed of nickel (Ni). However, in the semiconductor package 100 of the present embodiment, the material constituting the upper metal layer 134 is not limited to Ni. For example, the upper metal layer 134 may include or be formed of one or more of various metal materials that do not cause diffusion in silicon of the first semiconductor chip 120. In the semiconductor package 100 of the present embodiment, for example, the upper metal layer 134 may include or be formed of tin (Sn) instead of Ni. For example, the through post 130 may include a metal material layer including the lower copper metal layer and an upper nickel metal layer.

As shown in FIG. 1, the lower metal layer 132 may occupy most of the through post 130, and the upper metal layer 134 may exist only in an upper portion of the through post 130. For example, the lower metal layer 132 may occupy more than a half of the whole thickness of the through post 130, and the upper metal 134 may occupy less than a half of the whole thickness of the through post 130. The thicknesses may be measured in a vertical direction. For example, the thicknesses may be vertical lengths of layers. Also, the thickness of the upper metal layer 134 may be different from one through post 130 to another. For example, the upper metal layer 134 of the through post 130 arranged first from the left may have a first thickness D1, and the upper metal layer 134 of the through post 130 arranged second from the left may have a second thickness D2. Also, the first thickness D1 may be greater than the second thickness D2. Also, since the through posts 130 are arranged between the first redistribution substrate 110 and the second redistribution substrate 140 to electrically connect them to each other, when the semiconductor package 100 has no defects like warpage, the overall thickness or length of the through posts 130 in the third direction (z direction) may be uniform to some extent. Therefore, as the thickness of the upper metal layer 134 increases, the thickness of the lower metal layer 132 may decrease in inverse proportion thereto.

The second redistribution substrate 140 may be disposed over the first semiconductor chip 120, the through posts 130, and the sealing member 150. The second redistribution substrate 140 may have a structure similar to that of the first redistribution substrate 110. For example, the second redistribution substrate 140 may include a second body insulation layer 142 and second redistribution lines 144. The same descriptions regarding the first body insulation layer 112 and the first redistribution lines 114 of the first redistribution substrate 110 may be applied to the second body insulation layer 142 and the second redistribution lines 144. For example, the structure and the material of the second body insulating layer 142 and the second redistribution lines 144 may be the same as the first body insulation layer 112 and the first redistribution lines 114 respectively as described above with respect to the first body insulation layer 112 and the first redistribution lines 114.

Figure 3A:
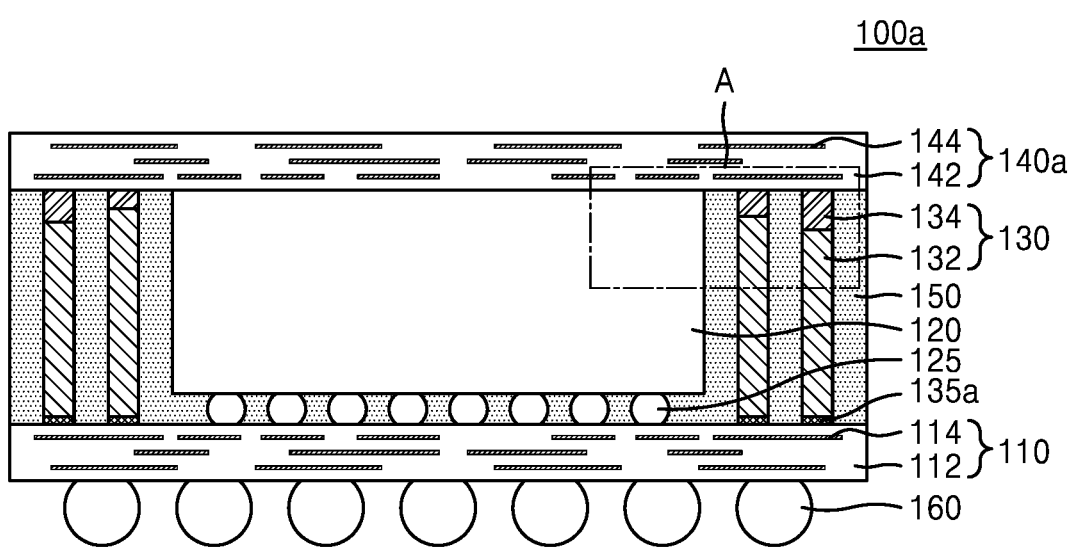
FIGS. 3A and 3B are respectively a schematic cross-sectional view and an enlarged view of a semiconductor package according to an embodiment.
Figure 3B:
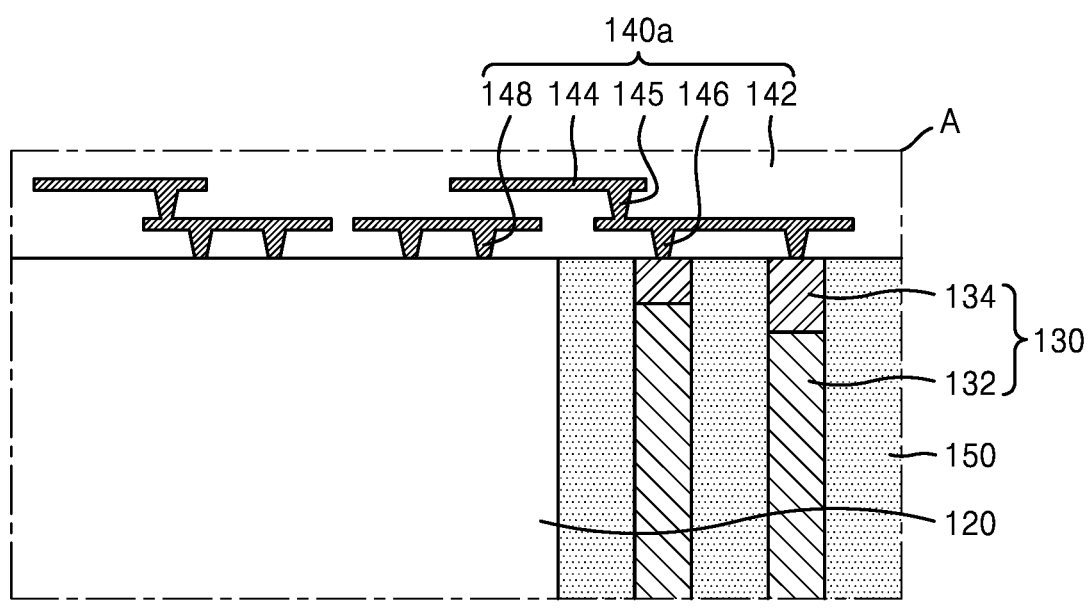

The second redistribution substrate 140 may further include first contact vias (refer to 146 of FIG. 3B) and vias (refer to 145 of FIG. 3B). The first contact vias 146 may electrically connect the second redistribution lines 144 to the through post 130. Also, the vias 145 may electrically connect the second redistribution lines 144 having multiple layers to one another. Also, the first redistribution substrate 110 may also include vias, and the first redistribution lines 114 having multiple layers may be electrically connected to one another through the vias. Upper substrate pads may be formed on the top surface of the first redistribution substrate 110. The upper substrate pads may be electrically connected to the through post 130 through the seed metals 135a.

The second redistribution lines 144 of the second redistribution substrate 140 may be electrically connected to the first semiconductor chip 120 and the first external connection terminals 160 through the through posts 130 and the first redistribution lines 114 of the first redistribution substrate 110. Therefore, the second redistribution substrate 140 may also contribute to redistribution of the chip pads of the first semiconductor chip 120.

Although not shown, a first passivation layer may be disposed on the bottom surface of the first redistribution substrate 110 and a second passivation layer may be disposed on the top surface of the second redistribution substrate 140. The first passivation layer may cover and protect the bottom surface of the first redistribution substrate 110, and the second passivation layer may cover and protect the top surface of the second redistribution substrate 140. The first passivation layer and the second passivation layer may include or be formed of an insulating material, e.g., a resin. However, the material constituting the first passivation layer and the second passivation layer is not limited thereto.

The sealing member 150 may be arranged between the first redistribution substrate 110 and the second redistribution substrate 140. The sealing member 150 may cover and seal side surfaces of the first semiconductor chip 120. For example, the sealing member 150 may seal the first semiconductor chip 120 to prevent a fluid communication from outside to the first semiconductor chip 120 together with the bumps 125 and the second redistribution substrate 140. For example, the sealing member 150 may contact the side surfaces and the bottom surface of the first semiconductor chip 120 and may further contact side surfaces of the bumps 125. Also, the sealing member 150 may surround side surfaces of the through posts 130. For example, the sealing member 150 may contact side surfaces of the through posts 130. As shown in FIG. 1, the sealing member 150 may surround the side surfaces of the first semiconductor chip 120 and may also fill spaces between the bumps 125 on the bottom surface of the first semiconductor chip 120. For example, the sealing member 150 may contact the bumps 125. However, according to some embodiments, the spaces between the bumps 125 may be filled with an underfill, and the sealing member 150 may surround only sidewalls of the first semiconductor chip 120 and the underfill.

The sealing member 150 may include or be formed of an insulation material, e.g., a thermosetting resin like an epoxy resin, a thermoplastic resin like polyimide, or aforementioned resin further including a reinforcing material like an inorganic filler (in detail, ABF, FR-4, BT resin, etc.). Also, a molding material like EMC or a photosensitive material like photo-imageable sealing member (PIE) may be used for the sealing member 150. Of course, the material of the sealing member 150 is not limited to the above-stated materials.

As described above, the first external connection terminals 160 are arranged on the external connection pads on the bottom surface of the first redistribution substrate 110 and may be electrically connected to the first redistribution lines 114 through the external connection pads. The first external connection terminals 160 may electrically connect the semiconductor package 100 to a package substrate or a main board of an electronic device. The first external connection terminals 160 may include or be formed of a conductive material, e.g., at least one of solder, tin (Sn), silver (Ag), Cu, and aluminum (Al).

At least one semiconductor chip and/or at least one passive device may be stacked/disposed/mounted on the top surface of the second redistribution substrate 140. Also, the at least one semiconductor chip and/or the at least one passive element may be stacked/disposed/mounted on the second redistribution substrate 140 as an upper package structure. A structure of a semiconductor package in which an upper package structure is stacked/disposed/mounted on the second redistribution substrate 140 may correspond to a package-on-package (POP) structure. A semiconductor package having the POP structure will be described later in more detail with reference to FIG. 5.

In the semiconductor package 100 of the present embodiment, the first semiconductor chip 120 is disposed between the first redistribution substrate 110 and the second redistribution substrate 140, such that the top surface of the first semiconductor chip 120 contacts the bottom surface of the second redistribution substrate 140. Therefore, as indicated by small arrows in FIG. 1, heat generated from the first semiconductor chip 120 may be effectively dissipated to the outside through the second redistribution substrate 140.

Also, in the semiconductor package 100 of the present embodiment, the sealing member 150 may not be provided between the first semiconductor chip 120 and the second redistribution substrate 140. Therefore, as compared to a semiconductor package of a comparative example having a structure in which a sealing member is provided between a first semiconductor chip and a second redistribution substrate, the thickness of the semiconductor package 100 may be reduced as much as the thickness of a sealing member that is omitted between the first semiconductor chip 120 and the second redistribution substrate 140 in the present embodiment. For example, when the thickness of a sealing member provided between the first semiconductor chip and the second redistribution substrate in the semiconductor package of the comparative example is about dozens of the thickness of the semiconductor package 100 of the present embodiment may be reduced by dozens of μm as compared to the semiconductor package of the comparative example.

As a result, the semiconductor package 100 of the present embodiment may contribute to thickness reduction of a semiconductor package.

In the semiconductor package 100 of the present embodiment, the through post 130 may have a structure including heterogeneous metal layers. For example, the through post 130 may include or be formed of the lower metal layer 132 including Cu and the upper metal layer 134 including Ni. Since the through post 130 includes the upper metal layer 134 including Ni, a defect that Cu is diffused into silicon of the first semiconductor chip 120 may be effectively prevented during a manufacturing process of the semiconductor package 100 and/or thereafter.

Figure 2A:
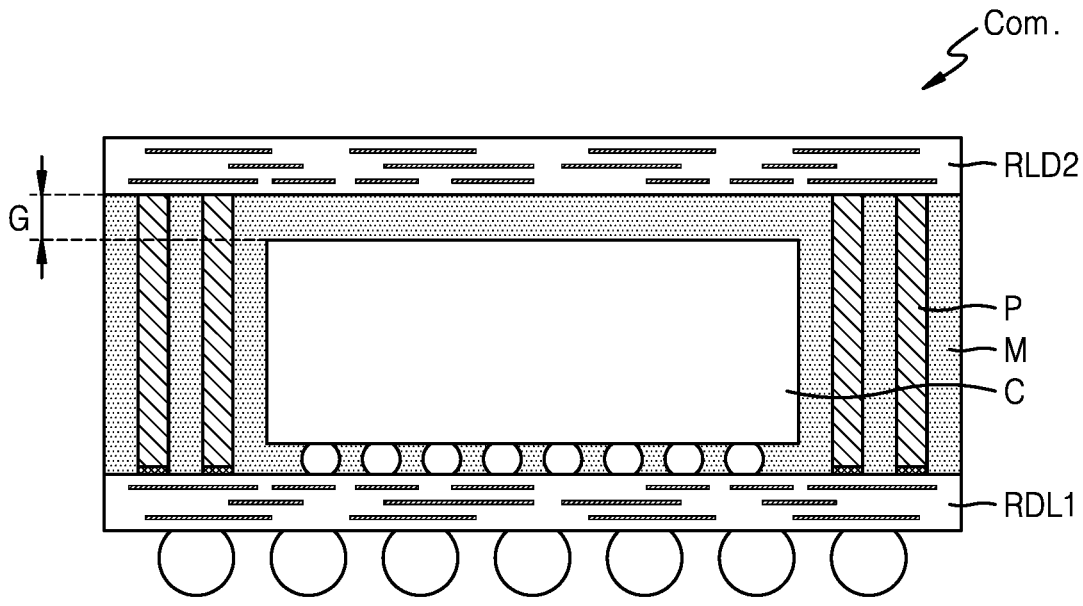
FIGS. 2A and 2B are respectively a cross-sectional view and a graph regarding semiconductor packages of comparative examples for describing/explaining heat dissipation efficiency according to arrangement structures of semiconductor chips.
Figure 2B:
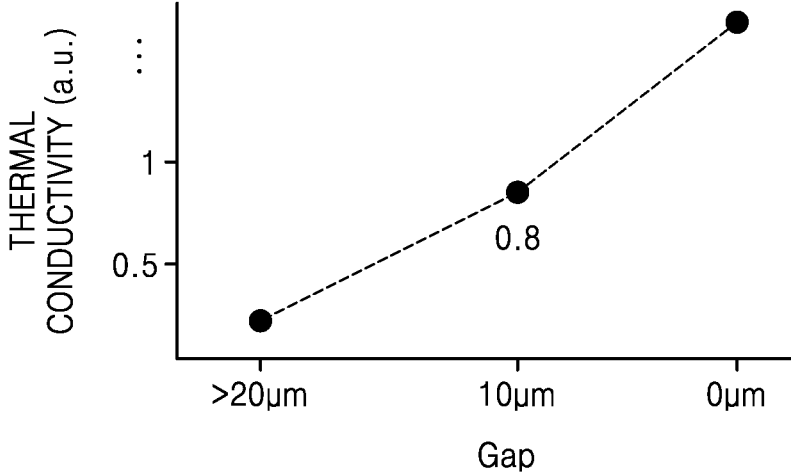

FIGS. 2A and 2B are respectively a cross-sectional view and a graph regarding semiconductor packages of comparative examples for describing/explaining heat dissipation efficiency according to arrangement structures of semiconductor chips. In the graph of FIG. 2B, the x-axis indicates a gap G between a semiconductor chip C and an upper redistribution substrate RLD2 in μm, and the y-axis indicates thermal conductivity in an arbitrary unit.

Referring to FIGS. 2A and 2B, in a semiconductor package Com. of the comparative example, when the gap G between the semiconductor chip C and the upper redistribution substrate RLD2 is 0 (e.g., the semiconductor chip C is exposed from a sealing member M and contacts the bottom surface of the upper redistribution substrate RLD2), the thermal conductivity may exceed 1 and be very high. This may indicate that the semiconductor package Com. has excellent heat dissipation efficiency.

On the other hand, in the semiconductor package Com. of the comparative example, when the gap G between the semiconductor chip C and the upper redistribution substrate RLD2 is about 10 μm, the thermal conductivity is about 0.8, and, when the gap G increases to about 20 μm or more, the thermal conductivity decreases to about 0.2 or less. It may indicate that, as the gap G increases, the heat dissipation efficiency of the semiconductor package Com. is deteriorated.

The reason that the heat dissipation efficiency of the semiconductor package Com. is deteriorated as the gap G increases is because the sealing member M having a thickness corresponding to the gap G is provided between the semiconductor chip C and the upper redistribution substrate RLD2. The sealing member M may exhibit relatively low thermal conductivity as compared to the upper redistribution substrate RLD2 including redistribution lines and vias therein. Therefore, the sealing member M between the semiconductor chip C and the upper redistribution substrate RLD2 may act as interference to dissipation of heat from the semiconductor chip C to the outside. Therefore, to improve the heat dissipation efficiency of the semiconductor package, the gap G between the semiconductor chip C and the upper redistribution substrate RLD2 needs to be minimized.

For reference, in the structure of the semiconductor package Com. of the comparative example, a through post P may have a single metal layer structure and may include Cu. When the through post P has a single metal layer structure including Cu, the semiconductor chip C may have a structure in which the top surface is covered by the sealing member M. In detail, a process of manufacturing the semiconductor package Com. of the comparative example includes a process of removing an upper portion of the sealing member M through a planarization process like chemical mechanical polishing (CMP) to expose the top surface of the through post P. At this time, to prevent Cu of the through post P from contaminating the semiconductor chip C through diffusion into silicon, a process of exposing the top surface of the through post P may be performed while maintaining a state in which the sealing member M covers the top surface of the semiconductor chip C. As a result, in the case of a semiconductor package in which the through post P has a single metal layer structure including Cu, it is necessary to provide the sealing member M between the semiconductor chip C and the upper redistribution substrate RLD2.

On the other hand, as shown in FIG. 1, in the case of the semiconductor package 100 of the present embodiment, the through post 130 may include the upper metal layer 134 including Ni. Therefore, it is not necessary to worry about contamination of the first semiconductor chip 120 by diffusion of Cu into silicon during a process of planarizing the sealing member 150. As a result, in the process of planarizing the sealing member 150, the sealing member 150 on the top surface of the first semiconductor chip 120 may be completely removed, thereby exposing the top surface of the first semiconductor chip 120. Also, in a process of forming the second redistribution substrate 140, the top surface of the first semiconductor chip 120 may contact the bottom surface of the second redistribution substrate 140.

FIGS. 3A and 3B are respectively a cross-sectional view and an enlarged view schematically showing the structure of a semiconductor package according to an embodiment, wherein FIG. 3B is an enlarged cross-sectional view of a portion A of FIG. 3A. Descriptions already given above with reference to FIGS. 1 to 2B are briefly given or omitted in the following descriptions for brevity.

Referring to FIGS. 3A and 3B, a semiconductor package 100a of the present embodiment may be different from the semiconductor package 100 of FIG. 1, in that a second redistribution substrate 140a further includes second contact vias 148. For example, in the case of the semiconductor package 100 of FIG. 1, the second redistribution substrate 140 may include the second body insulation layer 142, the second redistribution lines 144, the vias 145, and the first contact vias 146. The vias 145 may electrically connect the second redistribution lines 144 having multiple layers to one another, and the first contact vias 146 may electrically connect the second redistribution lines 144 to the through posts 130, respectively. In FIG. 1, the vias 145 and the first contact vias 146 are omitted and not shown.

On the contrary, in the semiconductor package 100a of the present embodiment, the second redistribution substrate 140a may include the second body insulation layer 142, the second redistribution lines 144, the vias 145, the first contact vias 146, and the second contact vias 148. The vias 145 and the first contact vias 146 are the same as those of the second redistribution substrate 140 described above.

The second contact vias 148 may be arranged between the second redistribution lines 144 and the first semiconductor chip 120. For example, the second contact vias 148 may vertically overlap the first semiconductor chip 120 and the second redistribution lines 144. Also, the second contact vias 148 may contact the top surface of the first semiconductor chip 120. The top surface of the first semiconductor chip 120 may be an inactive surface as described above. For example, the second vias 148 may be electrically insulated from the circuit formed in the first semiconductor chip 120. Therefore, the second contact vias 148 may not provide an electrical connection to the first semiconductor chip 120. However, since the second contact vias 148 include or be formed of a metal, the second contact vias 148 may effectively transfer heat generated from the first semiconductor chip 120 to the second redistribution lines 144. As a result, the semiconductor package 100a of the present embodiment may more effectively dissipate heat from the first semiconductor chip 120 through the second contact vias 148 connecting the second redistribution lines 144 and the top surface of the first semiconductor chip 120. For example, in the semiconductor package 100a of the present embodiment, heat dissipation efficiency may be maximized due to the second contact vias 148.

Figure 4A:
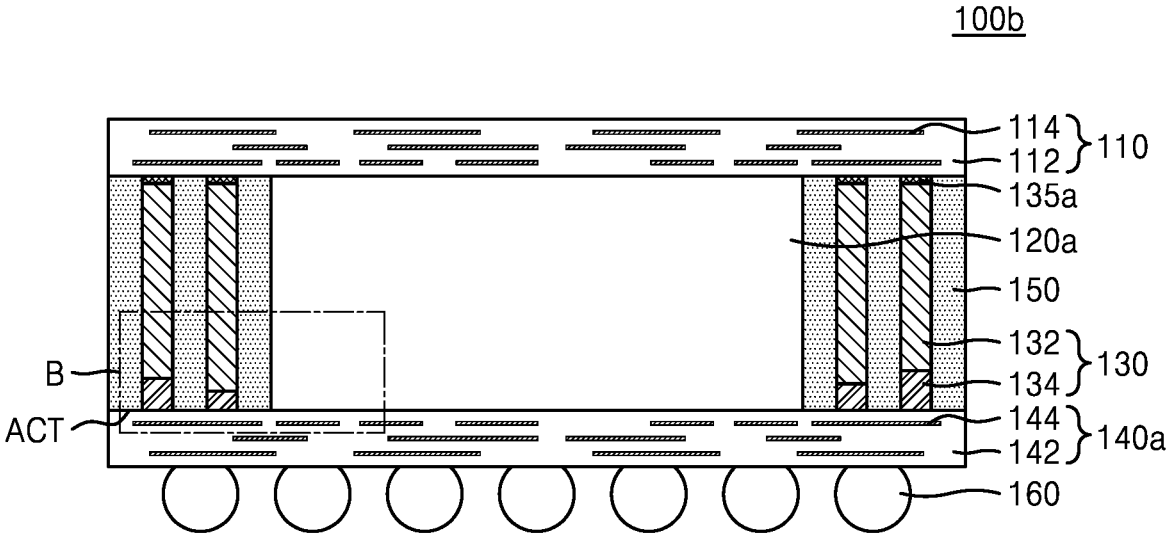
FIGS. 4A and 4B are respectively a schematic cross-sectional view and an enlarged view of a semiconductor package according to an embodiment.
Figure 4B:
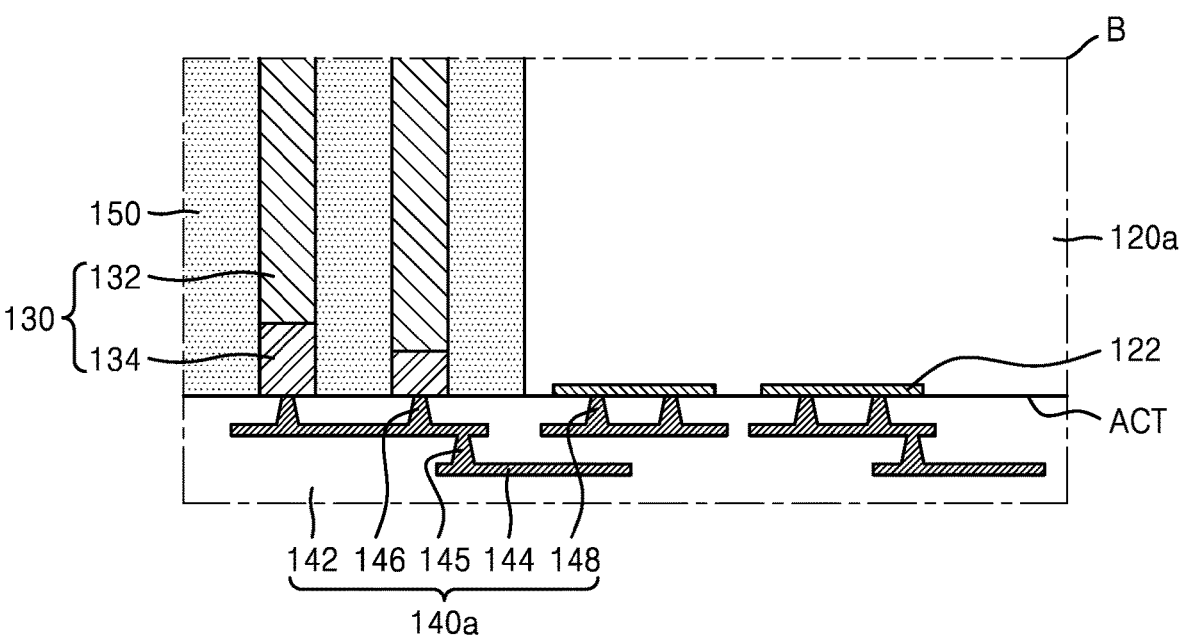

FIGS. 4A and 4B are respectively a cross-sectional view and an enlarged view schematically showing the structure of a semiconductor package according to an embodiment, wherein FIG. 4B is an enlarged cross-sectional view of a portion B of FIG. 4A. Descriptions already given above with reference to FIGS. 1 to 3B are briefly given or omitted in the following descriptions for brevity.

Referring to FIGS. 4A and 4B, a semiconductor package 100b of the present embodiment may be different from the semiconductor package 100 or 100a of FIG. 1 or FIGS. 3A and 3B, in that a first semiconductor chip 120a is mounted directly on the second redistribution substrate 140a without bumps. For example, as compared to the semiconductor package 100 or 100a of FIG. 1 or FIGS. 3A and 3B, in the semiconductor package 100b of the present embodiment, locations of the first semiconductor substrate 110 and the second redistribution substrate 140a may be reversed around the first semiconductor chip 120a. For example, the second redistribution substrate 140a may be disposed below the first semiconductor chip 120a, and the first redistribution substrate 110 may be disposed above the first semiconductor chip 120a. Also, the first external connection terminals 160 may be arranged on the bottom surface of the second redistribution substrate 140a.

As shown in FIGS. 4A and 4B, the upper metal layer 134 of the through post 130 may be electrically connected to and/or contact the second redistribution substrate 140a. Also, as shown in FIG. 4B, the bottom surface of the first semiconductor chip 120a is an active surface ACT, and the second redistribution lines 144 of the second redistribution substrate 140a may be electrically connected to chip pads 122 of the active surface ACT through second contact vias 148. For example, the second contact vias 148 may contact the chip pads 122. A method of manufacturing the semiconductor package 100b of the present embodiment will be described later in more detail with reference to FIGS. 8A to 8D.

Figure 5:
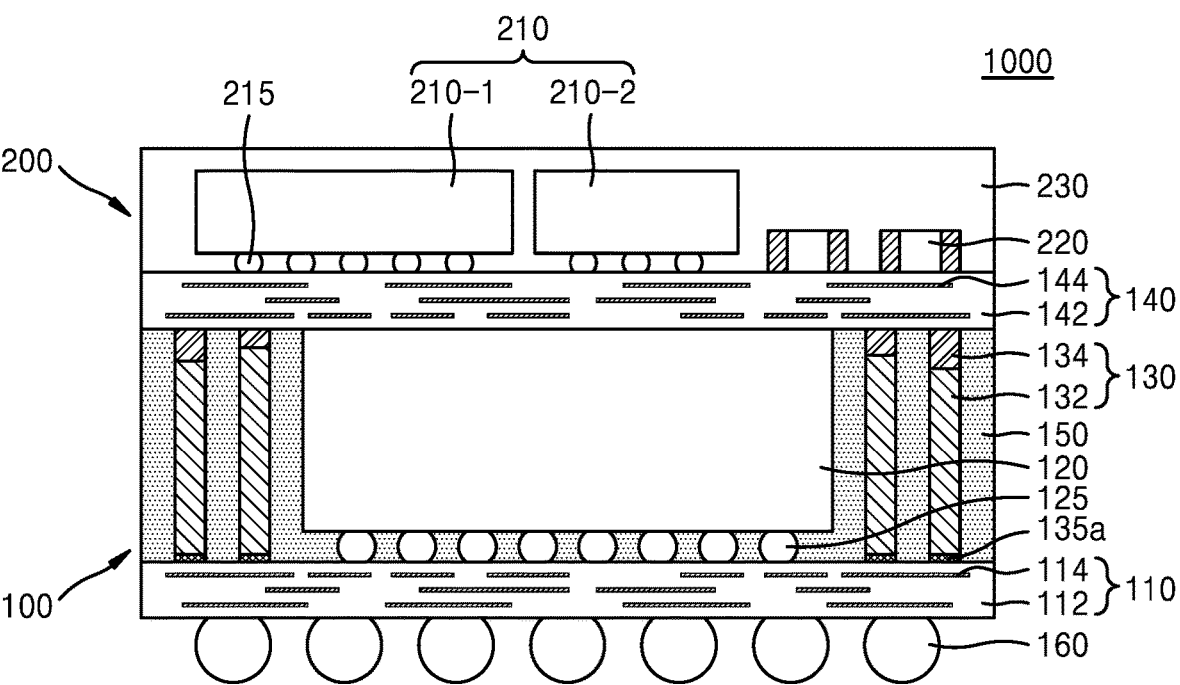
FIG. 5 is a schematic cross-sectional view of a semiconductor package according to an embodiment.

FIG. 5 is a schematic cross-sectional view of a semiconductor package according to an embodiment. Descriptions already given above with reference to FIGS. 1 to 4B will be briefly given or omitted in the following descriptions for brevity.

Referring to FIG. 5, a semiconductor package 1000 of the present embodiment may be different from the semiconductor package 100 of FIG. 1, in that the semiconductor package 1000 further includes an upper package 200. For example, the semiconductor package 1000 of the present embodiment may include a lower package 100 and the upper package 200. The structure in which a package is stacked on another package as described above is referred to as a POP structure. The lower package 100 may be the same or substantially the same as the semiconductor package 100 of FIG. 1. However, the semiconductor package 1000 of the present embodiment may include the semiconductor package 100a of FIG. 3A instead of the semiconductor package 100 of FIG. 1 as a lower package.

Terms such as "same," "equal," "planar," "symmetry," or "coplanar," as used herein encompass identicality or near identicality including variations that may occur, for example, due to manufacturing processes. The term "substantially" may be used herein to emphasize this meaning, unless the context or other statements indicate otherwise.

The upper package 200 may include at least one second semiconductor chip 210, at least one passive device 220, and an upper sealing member 230.

The second semiconductor chip 210 may be a memory semiconductor chip. For example, the memory semiconductor chip may include or may be, for example, a volatile memory device like a dynamic random access memory (DRAM) and a static random access memory (SRAM) or a non-volatile memory device like a flash memory. However, the second semiconductor chip 210 is not limited to a memory semiconductor chip. For example, according to some embodiments, the second semiconductor chip 210 may be a logic semiconductor chip.

As shown in FIG. 5, the upper package 200 may include two second semiconductor chips 210-1 and 210-2. The two second semiconductor chips 210-1 and 210-2 may be semiconductor chips of the same type or semiconductor chips of different types. The number of second semiconductor chips 210 of the upper package 200 is not limited to two. For example, the upper package 200 may include one, or three or more second semiconductor chips 210. In certain embodiments, a plurality of second semiconductor chips 210 may be arranged on the second redistribution substrate 140 in a stacked structure. For example, the second semiconductor chips 210 may be arranged on the second redistribution substrate 140 by being stacked on each other, e.g., stacked in a vertical direction, instead of being arranged on the second redistribution substrate 140 adjacent to each other in a horizontal direction as shown in FIG. 5.

The second semiconductor chips 210 may be arranged on the second redistribution substrate 140 through bumps 215. The bumps 215 may include or be formed of a conductive material, e.g., at least one of solder, Sn, Ag, Cu, and Al. In certain embodiments, the second semiconductor chips 210 may be arranged on the second redistribution substrate 140 through wires instead of the bumps 215. Also, when the second semiconductor chips 210 are arranged on the second redistribution substrate 140 in a stacked structure through wires, the second semiconductor chips 210 may be stacked in a stepped structure or a zigzag structure. For reference, when a second semiconductor chip 210 is disposed over the second redistribution substrate 140 through the bumps 215, the bottom surface of the second semiconductor chip 210 may correspond to or may be an active surface, and, when the second semiconductor chip 210 is disposed over the second redistribution substrate 140 through wires, the top surface of the second semiconductor chip 210 may correspond to or may be an active surface.

The passive device 220 may include or may be a 2-terminal device like resistors, capacitors, and inductors. In FIG. 5, two passive devices 220 are arranged on the second redistribution substrate 140. However, the number of passive devices 220 arranged on the second redistribution substrate 140 is not limited to two.

The upper sealing member 230 may seal the second semiconductor chip 210 and the passive devices 220 to protect the second semiconductor chip 210 and the passive devices 220 from external physical and chemical damage. For example, the upper sealing member 230 may seal the second semiconductor chip 210 and the passive devices 220 to prevent a fluid communication from outside to the second semiconductor chip 210 and the passive devices 220 together with the bumps 215 and or the second redistribution substrate 140. For example, the upper sealing member 230 may contact side surfaces, top and bottom surfaces of the second semiconductor chips 210 and the passive devices 220. Also, the upper sealing member 230 may fill between the bumps 215 between the second semiconductor chip 210 and the second redistribution substrate 140. For example, the upper sealing member 230 may surround the bumps 215 and may contact side surfaces of the bumps 215. According to some embodiments, an underfill may fill between the bumps 215. In such a structure, the upper sealing member 230 may cover/contact side surfaces of the underfill.

The upper sealing member 230 may include or be formed of an insulation material, e.g., a thermosetting resin like an epoxy resin, a thermoplastic resin like polyimide, or aforementioned resin further including a reinforcing material like an inorganic filler (e.g., ABF, FR-4, BT resin, etc.). Also, a molding material like EMC or a photosensitive material like photo-imageable sealing member (PIE) may be used for the upper sealing member 230. Of course, the material of the upper sealing member 230 is not limited to the above-stated materials.

Figure 6A:
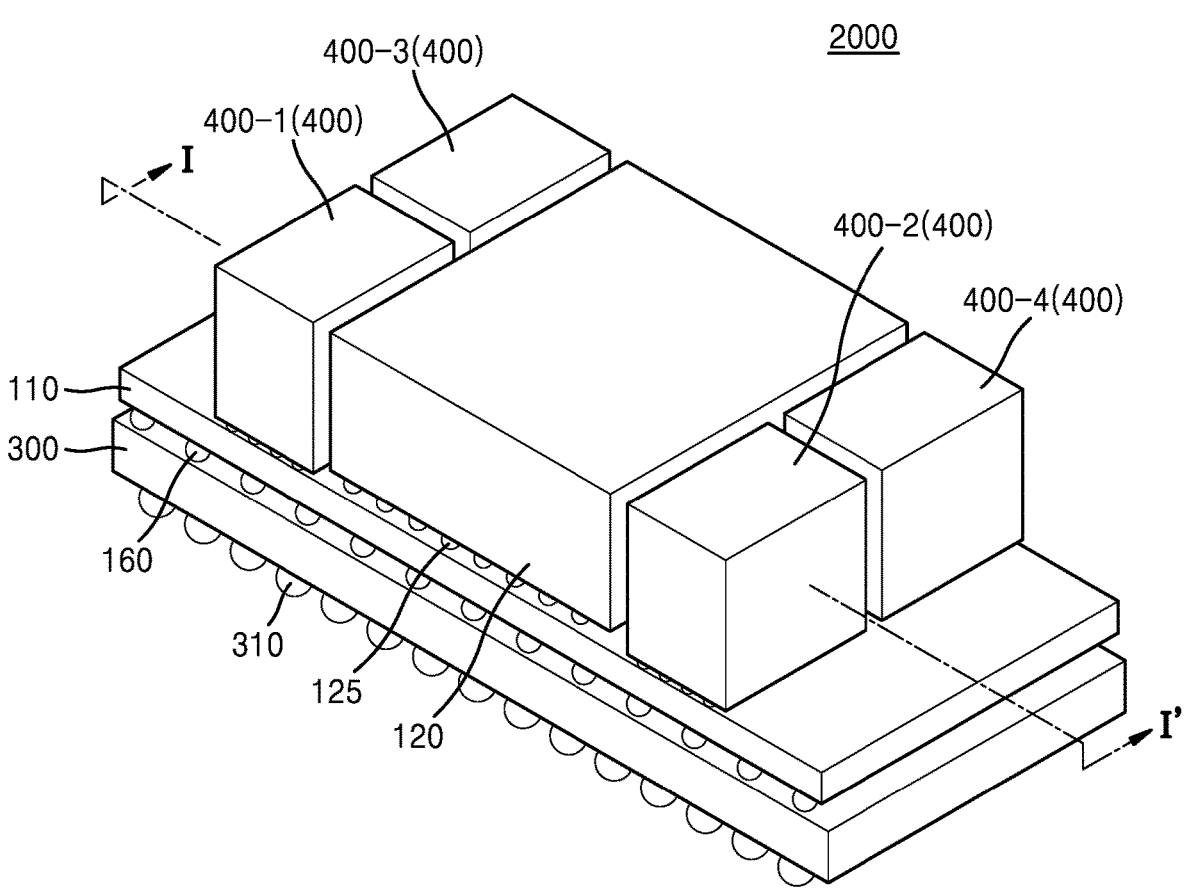
FIGS. 6A and 6B are respectively a perspective view and a schematic cross-sectional view of a semiconductor package according to an embodiment.
Figure 6B:
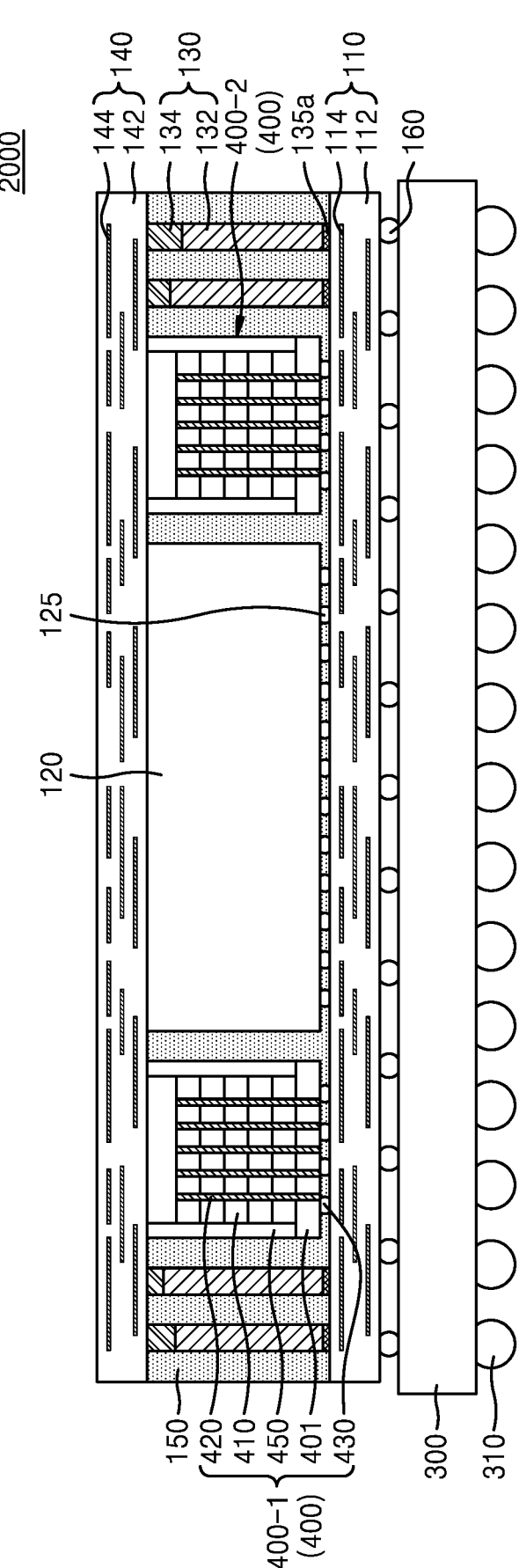

FIGS. 6A and 6B are respectively a perspective view and a schematic cross-sectional view of a semiconductor package according to an embodiment. Descriptions already given above with reference to FIGS. 1 to 5 are briefly given or omitted in the following descriptions for brevity.

Referring to FIGS. 6A and 6B, a semiconductor package 2000 of the present embodiment may be different from the semiconductor package 100 of FIG. 1, in that the semiconductor package 2000 further includes a package substrate 300 and a stacked memory package 400. For example, the semiconductor package 2000 of the present embodiment may include the first redistribution substrate 110, the first semiconductor chip 120, the through posts 130, the second redistribution substrate 140, the sealing member 150, the first external connection terminals 160, the package substrate 300, and the stacked memory package 400.

The first redistribution substrate 110, the first semiconductor chip 120, the through posts 130, the second redistribution substrate 140, the sealing member 150, and the first external connection terminals 160 may be identical or substantially identical to corresponding components of the semiconductor package 100 of FIG. 1, except that the stacked memory package 400 is further disposed over/on the first redistribution substrate 110. Therefore, except for the sealing member 150, detailed descriptions of the first redistribution substrate 110, the first semiconductor chip 120, the through posts 130, the second redistribution substrate 140, and the first external connection terminals 160 will be omitted. For brevity of drawing, in FIG. 6A, the through posts 130, the second redistribution substrate 140, and the sealing member 150 are omitted and not shown.

The package substrate 300 is a support substrate on which the first redistribution substrate 110 is mounted and may include at least one layer of wires therein. When wires are formed in multiple layers, wires of different layers may be connected to each other through vias. According to some embodiments, the package substrate 300 may include via electrodes directly connecting pads on the top surface and the bottom surface to each other. For example, certain via electrode formed in the package substrate 300 may contact a pad on the top surface of the package substrate 300 at one end of the via electrode and contact a pad on the bottom surface of the package substrate 300 at the other end of the via electrode. Although not shown, passivation layers like solder resist may be formed on the top surface and the lower surface of the package substrate 300. Substrate pads of the package substrate 300 may be electrically connected to wires of the wiring layer and exposed from a passivation layer.

The package substrate 300 may include or may be, for example, a ceramic substrate, a printed circuit board (PCB), an organic substrate, an interposer substrate, etc. According to some embodiments, the package substrate 300 may include or may be an active wafer like a silicon wafer. As shown in FIG. 6A, second external connection terminals 310 like bumps or solder balls may be arranged on the bottom surface of the package substrate 300. The second external connection terminals 310 may function to mount the entire semiconductor package 2000 on an external system substrate or a main board. According to some embodiments, the package substrate 300 may be omitted, and the entire semiconductor package 2000 may be mounted on an external system substrate or a main board through the first external connection terminals 160 of the first redistribution substrate 110.

The stacked memory package 400 may include first to fourth stacked memory packages 400-1 to 400-4 as shown in FIG. 6A. For example, two stacked memory packages 400 may be arranged on the first redistribution substrate 110 on each side of the first semiconductor chip 120. In the semiconductor package 2000 of the present embodiment, the number of stacked memory packages 400 is not limited to four. For example, one to three or five or more stacked memory packages 400 may be arranged on the first redistribution substrate 110.

The stacked memory package 400 may include, for example, a high-bandwidth memory (HBM) chip. For example, the stacked memory package 400 may include a base chip 401 and a plurality of semiconductor chips 410 stacked on the base chip 401, wherein the base chip 401 and the semiconductor chips 410 may include through electrodes 420 therein. The topmost semiconductor chip 410 among the semiconductor chips 410 may not include a through electrode 420.

The base chip 401 may include logic devices. Therefore, the base chip 401 may be a logic chip. The base chip 401 may be disposed under the semiconductor chips 410 to transmit signals from the semiconductor chips 410 to the outside of the stacked memory package 400 and may also transmit signals and power from the outside of the stacked memory package 400 to the semiconductor chips 410. Therefore, the base chip 401 may be referred to as a buffer chip or a control chip. The semiconductor chips 410 may include a plurality of memory devices, e.g., DRAM devices. The semiconductor chips 410 may be referred to as memory chips or core chips. The semiconductor chips 410 may be stacked on the base chip 401 through pad-to-pad bonding, bonding using a bonding member, or bonding using an anisotropic conductive film (ACF).

Bumps 430 may be arranged on the bottom surface of the base chip 401. The bumps 430 may be electrically connected to and/or contact the through electrodes 420. The bumps 430 may include or may be solder. However, according to some embodiment, the bumps 430 may have a structure including pillars and solders. The stacked memory package 400 may be mounted on the first redistribution substrate 110 through the bumps 430. The semiconductor chips 410 on the base chip 401 may be sealed by an inner sealing member 450. However, as shown in FIG. 6B, the topmost semiconductor chip 410 from among the semiconductor chips 410 may not be covered by the inner sealing member 450. However, according to other embodiments, the top surface of the topmost semiconductor chip 410 may be covered by the inner sealing member 450. For example, the inner sealing member 450 may contact side surfaces of the semiconductor chips 410 and may not contact side surfaces of the base chip 401. In certain embodiments, the inner sealing member 450 may contact the top surface of the topmost semiconductor chip 410.

The sealing member 150 may cover and seal side surfaces of the first semiconductor chip 120, the through posts 130, and the stacked memory package 400 on the first redistribution substrate 110. For example, the sealing member 150 may contact side surfaces and a bottom surface of the stacked memory package 400. For example, the sealing member 150 may contact side surfaces of the inner sealing member 450 and side surfaces and a bottom surface of the base chip 401. The sealing member 150 may surround the bumps 430 and contact side surfaces of the bumps 430. As shown in FIG. 6B, the sealing member 150 may not cover the top surfaces of the first semiconductor chip 120 and the stacked memory package 400. However, according to other embodiments, the sealing member 150 may cover the top surface of the stacked memory package 400. Although not shown, the semiconductor package 2000 according to the present embodiment may further include an external sealing member that covers the first redistribution substrate 110, the second redistribution substrate 140, and the sealing member 150 on the package substrate 300. Also, similarly to the semiconductor package 100a of FIG. 5, according to some embodiments, an upper package may be disposed over (e.g., on top of) the second redistribution substrate 140.

For reference, the semiconductor package 2000 of the present embodiment may correspond to (e.g., may have) a 2.5D package structure. Generally, a 2.5D package structure is implemented by a Si interposer, and the semiconductor package 2000 of the present embodiment may have a structure in which a Si interposer is replaced with the first redistribution substrate 110. Therefore, the semiconductor package 2000 of the present embodiment may also correspond to a 2.5D package structure. The 2.5D package structure may be a relative concept with respect to a 3D package structure in which all semiconductor chips are stacked together on a package substrate without a Si interposer or the first redistribution substrate 110. Both the 2.5D package structure and the 3D package structure may be included in system-in-package (SIP) structures.

FIGS. 7A to 7L are cross-sectional views schematically showing a process/method of manufacturing a semiconductor package of FIG. 1. Descriptions of embodiments illustrated in FIGS. 7A and 7L will be given below with reference to FIG. 1, and descriptions already given above with reference to FIGS. 1 to 6B will be briefly given or omitted in the following descriptions for brevity.

Figure 7A:
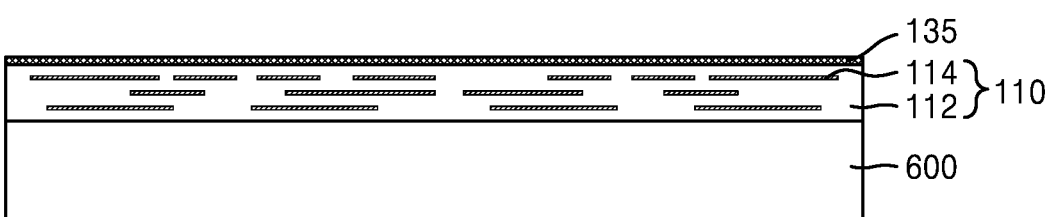
FIGS. 7A to 7L are cross-sectional views schematically showing a process of manufacturing the semiconductor package of FIG. 1.

Referring to FIG. 7A, in the method of manufacturing a semiconductor package of the present embodiment, first, the first redistribution substrate 110 is formed. As described above, the first redistribution substrate 110 may include the first body insulation layer 112 and the first redistribution lines 114. The first redistribution substrate 110 may be formed on a carrier substrate 600. The carrier substrate 600 may be a large-sized original substrate like a wafer. For example, the carrier substrate 600 may be a circular wafer. For example, the large-sized original substrate may be an initial size of a substrate provided in an initial process of a semiconductor device manufacturing process. In certain embodiments, the large-sized original substrate may be a substrate in/on which a plurality of semiconductor chips or packages are formed together. Also, a redistribution substrate formed on the carrier substrate 600 may also be a large-sized original redistribution substrate including a plurality of first redistribution substrates 110. A semiconductor package structure that is individualized through a singulation process after components are subsequently formed on the original redistribution substrate is referred to as a wafer-level package (WLP) structure. However, for convenience of explanation, only one first redistribution substrate 110 and components corresponding thereto are shown in FIGS. 7A to 7L.

Thereafter, seed metals 135 are formed on the first redistribution substrate 110. The seed metals 135 may be used in a subsequent electroplating process for forming the through posts 130. The seed metals 135 may include or be formed of at least one of various metal materials, e.g., Cu, Ti, Ta, TiN, and TaN. According to the method of manufacturing a semiconductor package of the present embodiment, for example, the seed metals 135 may include or be formed of Cu.

Figure 7B:
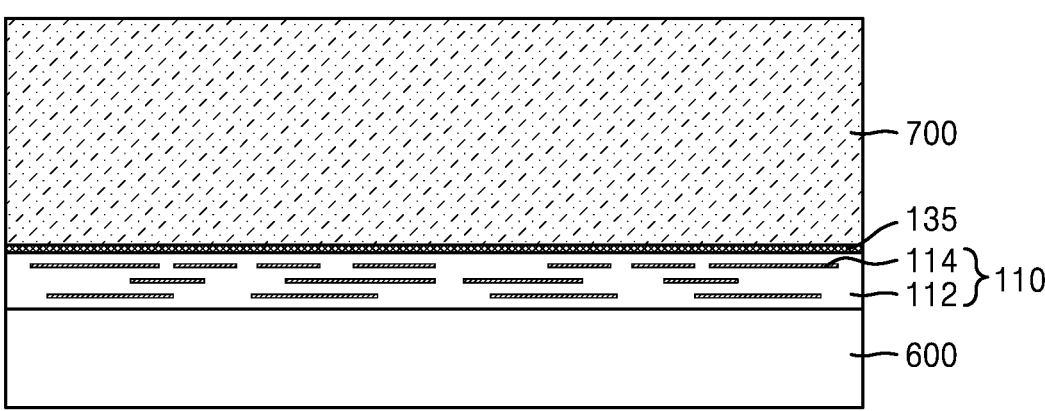

Referring to FIG. 7B, a photoresist (PR) 700 is applied over the seed metals 135 formed on the first redistribution substrate 110. The PR may be applied through, for example, a spin coating method using a spin coater.

Figure 7C:
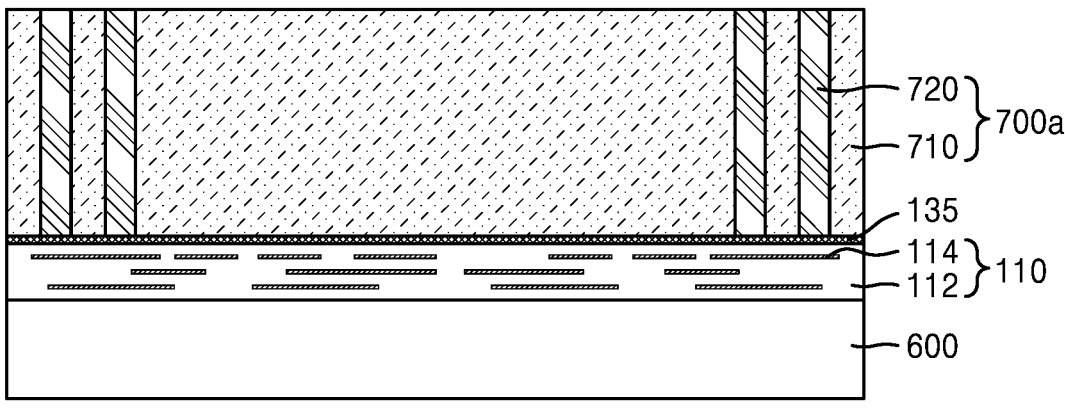

Referring to FIG. 7C, after the application of the PR, an exposure process is performed. The exposure process may be performed by using a mask including a particular pattern. For example, light may be radiated to a certain portion of the PR by transmitting light through a transparent portion of a transmissive mask. Chemical properties of the portion of the PR irradiated with light may be changed. For example, after the exposure process, a PR 700a may be divided into an unexposed portion 710 and an exposed portion 720. As shown in FIG. 7C, the exposed portion 720 may be located at an outer portion of the first redistribution substrate 110.

Figure 7D:
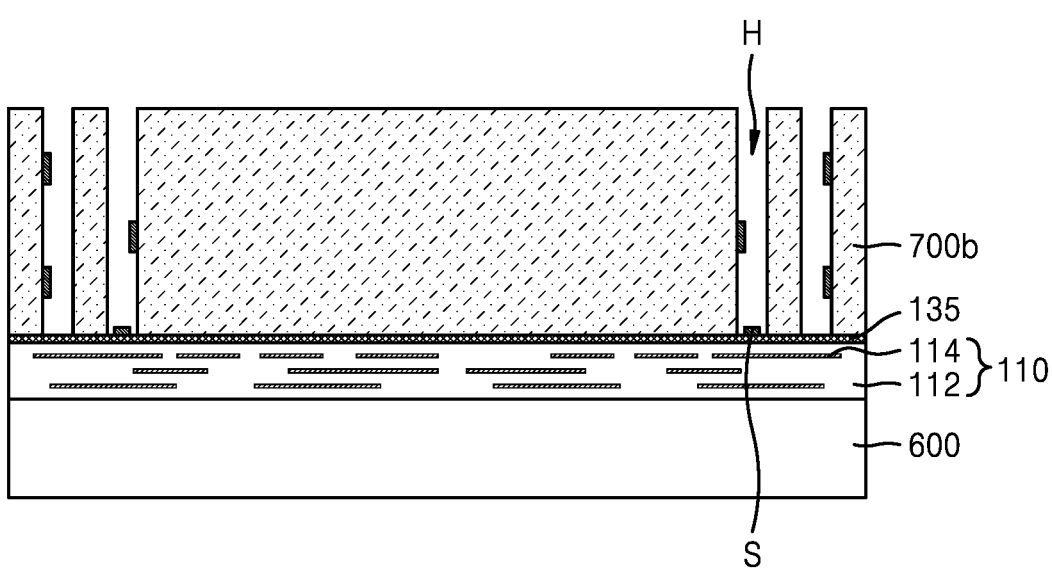

Referring to FIG. 7D, after the exposure process, a developing process is performed on the PR 700a. In the developing process, for example, the exposed portion 720 may be removed. For example, the PR 700a may be a positive PR. By removing the exposed portion 720 through the developing process, a PR pattern 700b may be formed. The PR pattern 700b may include a plurality of through holes H. The seed metals 135 may be exposed at the bottom surfaces of the through holes H. After the developing process, a by-product S like PR scum may remain inside the through holes H. According to some embodiments, a negative PR may be used, and, in this case, an unexposed portion may be removed in the developing process.

Figure 7E:
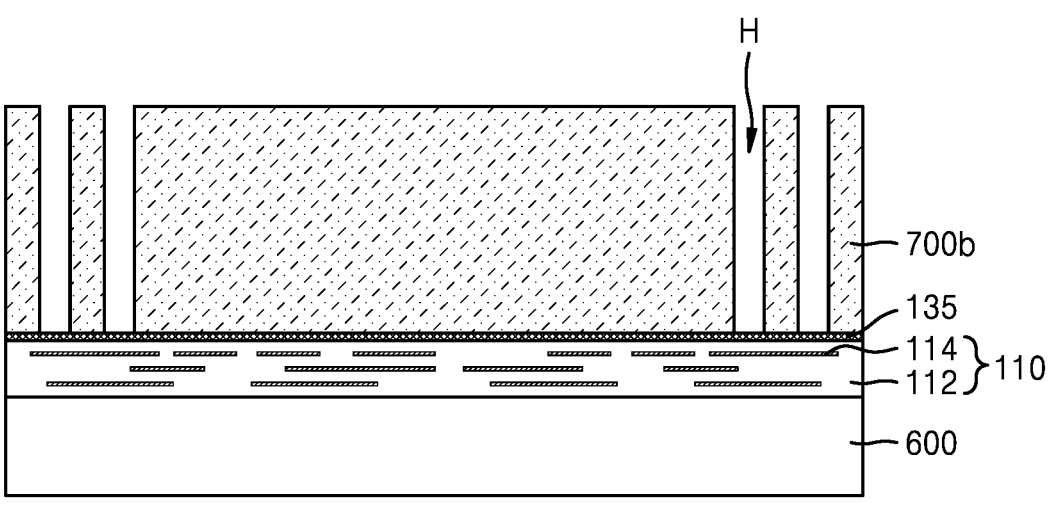

Referring to FIG. 7E, the by-product S is removed through a cleaning process. A process of removing the PR scum is referred to as a PR descum process. The PR descum process may be included in the cleaning process.

Figure 7F:
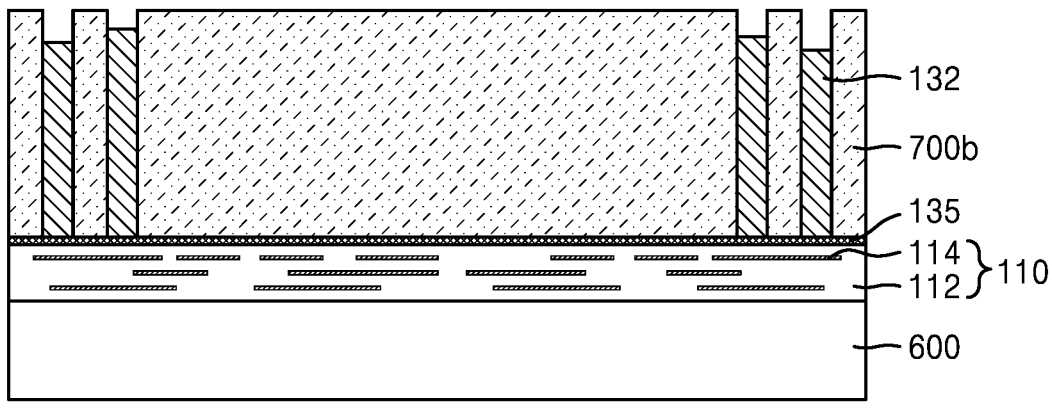

Referring to FIG. 7F, after the cleaning process, lower metal layers 132 are formed in the through holes H through an electroplating process. The lower metal layers 132 may include or be formed of, for example, Cu. In the case of the electroplating process, the height or the thickness of the lower metal layer 132 may be different from one through hole H to another due to various reasons. For example, even when electroplating is performed on all of the through holes H for the same time, the lower metal layers 132 having different thicknesses or heights may be formed in the through holes H, respectively. In FIG. 7F, the lower metal layers 132 having different heights for the respective through holes H are shown.

Figure 7G:
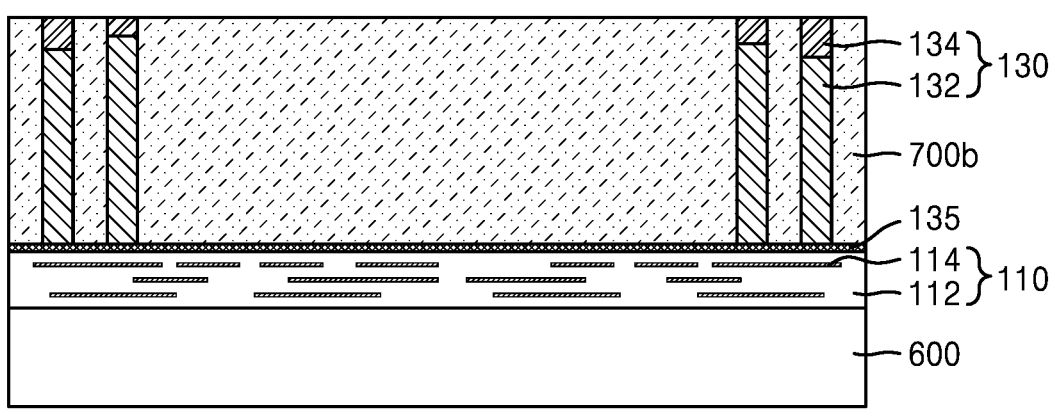

Referring to FIG. 7G, after the lower metal layers 132 are formed, upper metal layers 134 are formed on the lower metal layers 132 inside the through holes H through continuous electroplating. The upper metal layers 134 may include or be formed of, for example, Ni. The upper metal layers 134 may also be formed to have different thicknesses from one through hole H to another. Although FIG. 7G shows that the top surfaces of the upper metal layers 134 in all of the through holes H are at the same level, in reality, the heights of the top surfaces of the upper metal layers 134 may be different from one through hole H to another. Also, the upper metal layers 134 may be formed on portions of the top surface of the PR pattern 700b adjacent to the through holes H outside the through holes H.

As the upper metal layers 134 are formed, the through posts 130 may be completed. However, since a portion of the upper metal layer 134 may be removed in a subsequent process of planarizing the sealing member 150 in certain embodiments, the through post 130 may be completed in its final form after the process of planarizing the sealing member 150.

Figure 7H:
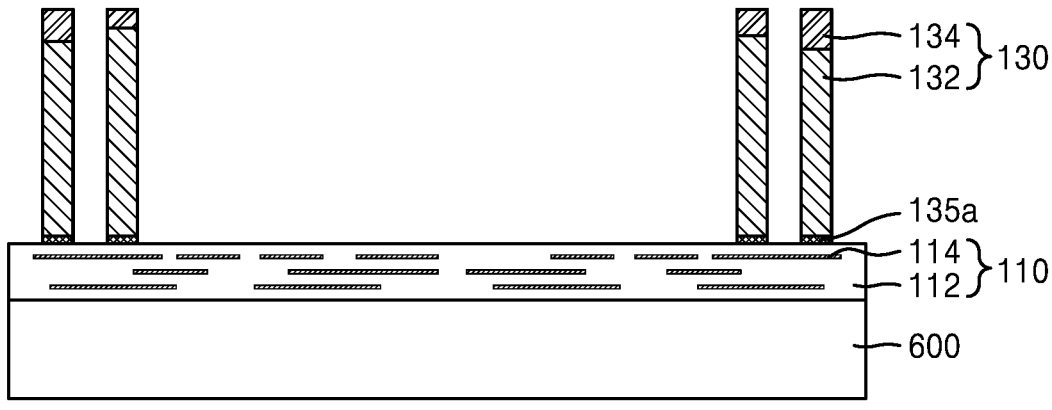

Referring to FIG. 7H, after the through posts 130 are formed, the PR pattern 700b is removed. The PR pattern 700b may be removed through a strip/ashing process. After the PR pattern 700b is removed, the seed metals 135 may be exposed between the through posts 130, e.g., in a plan view. Next, the exposed seed metals 135 are removed through an etching process. The top surface of the first redistribution substrate 110 may be exposed by removing the seed metals 135. Meanwhile, the seed metals 135a on the bottom surfaces of the through posts 130 may be maintained.

Figure 7I:
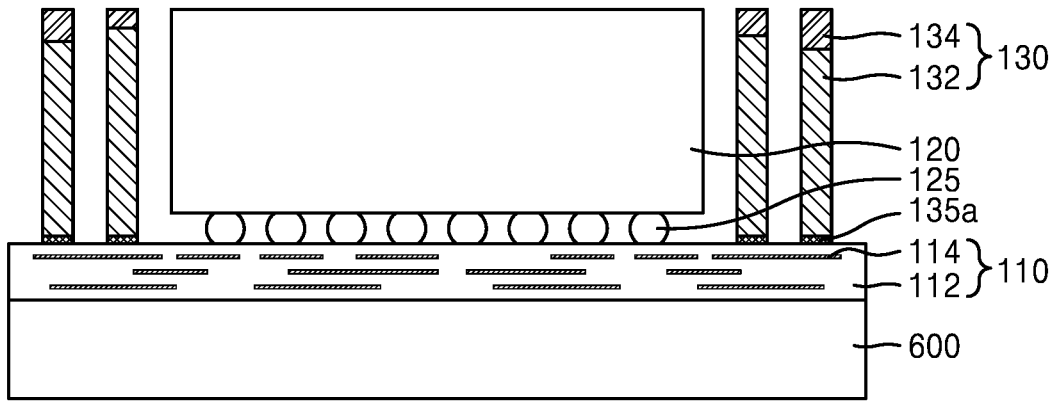

Referring to FIG. 7I, thereafter, the first semiconductor chip 120 is mounted on the central portion of the first redistribution substrate 110. The first semiconductor chip 120 may be mounted on the first redistribution substrate 110 in a flip-chip structure by using the bumps 125. According to some embodiments, an underfill may be filled between the bumps 125 between the first redistribution substrate 110 and the first semiconductor chip 120.

Figure 7J:
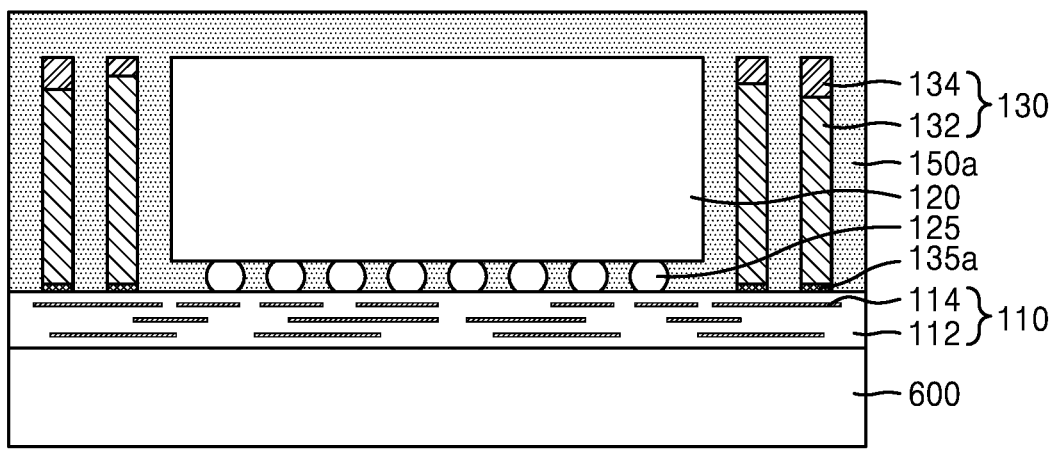

Referring to FIG. 7J, after the first semiconductor chip 120 is mounted, a sealing member 150a covering the first semiconductor chip 120 and the through posts 130 is formed on the first redistribution substrate 110. The sealing member 150a may cover side surfaces and top surfaces of the first semiconductor chip 120 and the through posts 130. The material constituting the sealing member 150a is the same as that of the sealing member 150 of the semiconductor package 100 of FIG. 1.

Figure 7K:
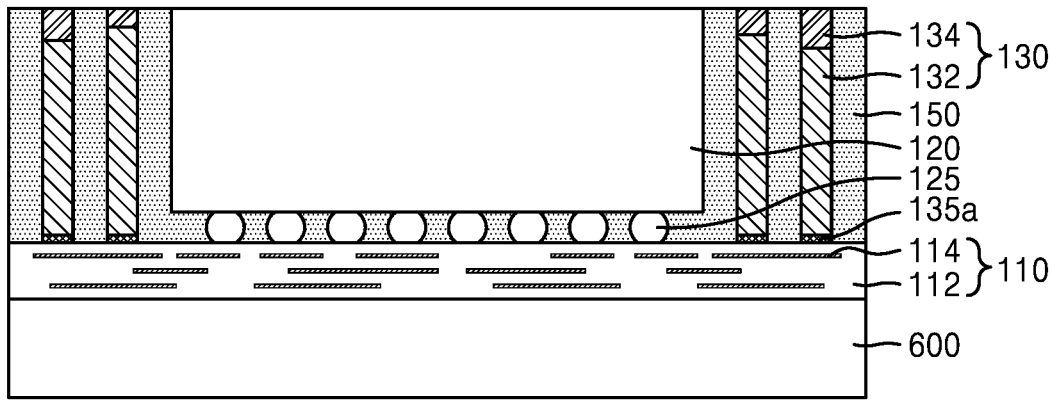

Referring to FIG. 7K, thereafter, a planarization process of removing an upper portion of the sealing member 150a is performed. The planarization process may be performed, for example, through CMP. Through the planarization process, the top surface of the first semiconductor chip 120 and the top surfaces of the through posts 130 may be exposed from the sealing member 150. For example, after the planarization process, the top surface of the first semiconductor chip 120, the top surfaces of the through posts 130, and the top surface of the sealing member 150 may be substantially coplanar.

The top surface of the through post 130 may be the top surface of the upper metal layer 134 including Ni. Therefore, contamination of the first semiconductor chip 120 due to diffusion of Cu into silicon may not occur during the planarization process. As a result, even when the top surface of the first semiconductor chip 120 is exposed during the planarization process, there may be no problem. For example, there may be no diffusion problem in the first semiconductor chip 120.

For reference, when a through post includes a single metal layer of Cu, the top surface of the metal layer of copper Cu may be exposed during the planarization process. Therefore, to prevent contamination of the first semiconductor chip 120 by diffusion of Cu into silicon, it is necessary to maintain a sealing member having a certain thickness on the top surface of the first semiconductor chip 120. However, when a sealing member is maintained on the top surface of the first semiconductor chip 120, heat dissipation efficiency of the semiconductor package may be deteriorated, and the overall thickness of the semiconductor package may also be increased. However, in the case of the semiconductor package 100 of the present embodiment, since the through post 130 includes the upper metal layer 134 of Ni in an upper portion of the through post 130, all of the above-stated problems may be solved.

Figure 7L:
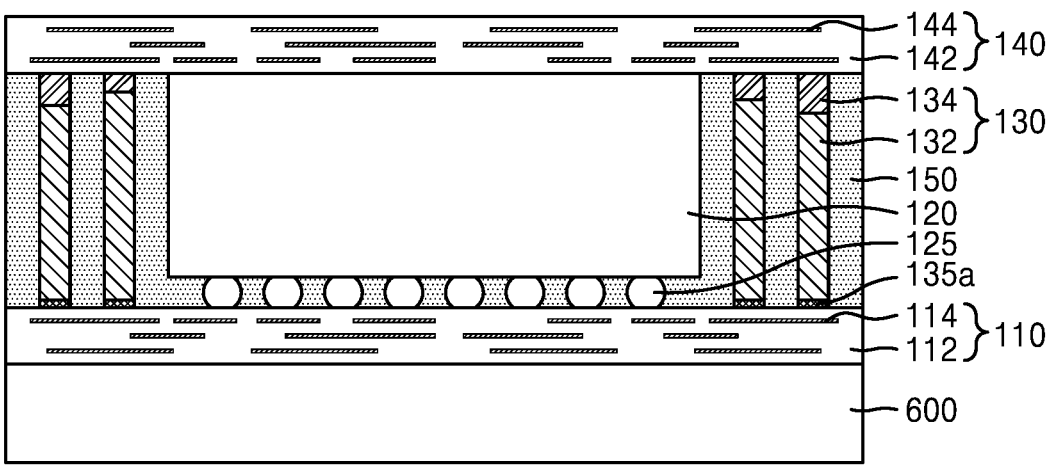

Referring to FIG. 7L, the second redistribution substrate 140 is formed on the first semiconductor chip 120, the through posts 130, and the sealing member 150. The second redistribution substrate 140 is the same as the second redistribution substrate 140 of the semiconductor package 100 of FIG. 1 described above. Thereafter, the semiconductor package 100 of FIG. 1 may be completed by separating the carrier substrate 600 from the other structure (e.g., including the first redistribution substrate 110) and disposing the first external connection terminals 160 on the bottom surface of the first redistribution substrate 110. In certain embodiments, as described above, the processes of FIGS. 7A to 7L may be performed at the wafer level, and the semiconductor package 100 of FIG. 1 may be completed through a singulation process.

As the top surface of the first semiconductor chip 120 is exposed in the planarization process, in a process of forming the second redistribution substrate 140, the bottom surface of the second redistribution substrate 140 may contact the top surface of the first semiconductor chip 120. Therefore, heat dissipation efficiency of the semiconductor package 100 may be improved, and an overall thickness of the semiconductor package 100 may be reduced. Furthermore, when the second redistribution substrate 140 is formed, the second contact vias 148 may be formed to contact with the top surface of the first semiconductor chip 120, thereby further improving the heat dissipation efficiency of the semiconductor package 100a.

FIGS. 8A to 8D are cross-sectional views schematically showing a process of manufacturing a semiconductor package of FIG. 4A. Descriptions of embodiments illustrated in FIGS. 8A to 8D will be given below with reference to FIG. 4A, and descriptions already given above with reference to FIGS. 7A to 7L will be briefly given or omitted in the following descriptions for brevity.

Figure 8A:
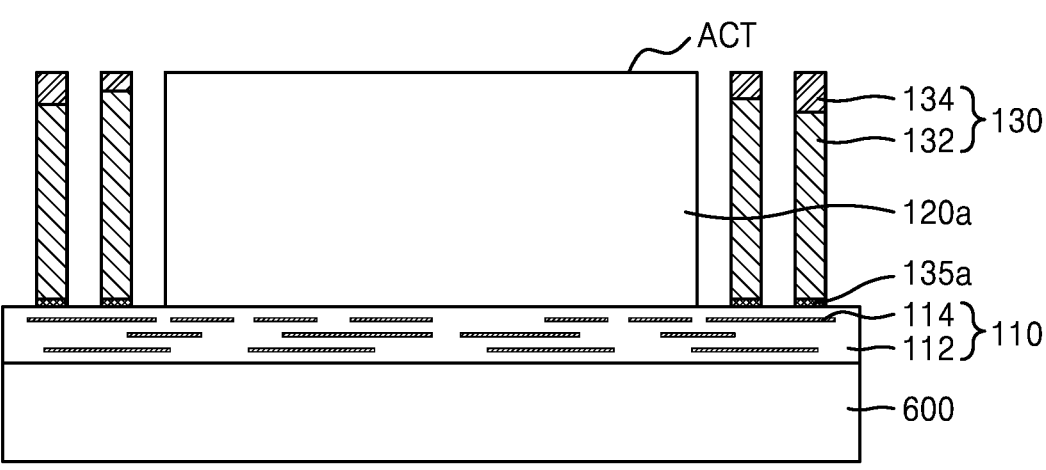
FIGS. 8A to 8D are cross-sectional views schematically showing a process of manufacturing the semiconductor package of FIG. 4A.

Referring to FIG. 8A, in the method of manufacturing a semiconductor package according to the present embodiment, after the PR pattern 700b and the seed metals 135 are removed through the processes of FIGS. 7A to 7H, the first semiconductor chip 120a is stacked on the first redistribution substrate 110. The first semiconductor chip 120a may be disposed, such that the active surface ACT faces upward and the inactive surface faces the first redistribution substrate 110. Although not shown, an adhesive layer may be present between the first semiconductor chip 120a and the first redistribution substrate 110.

Figure 8B:
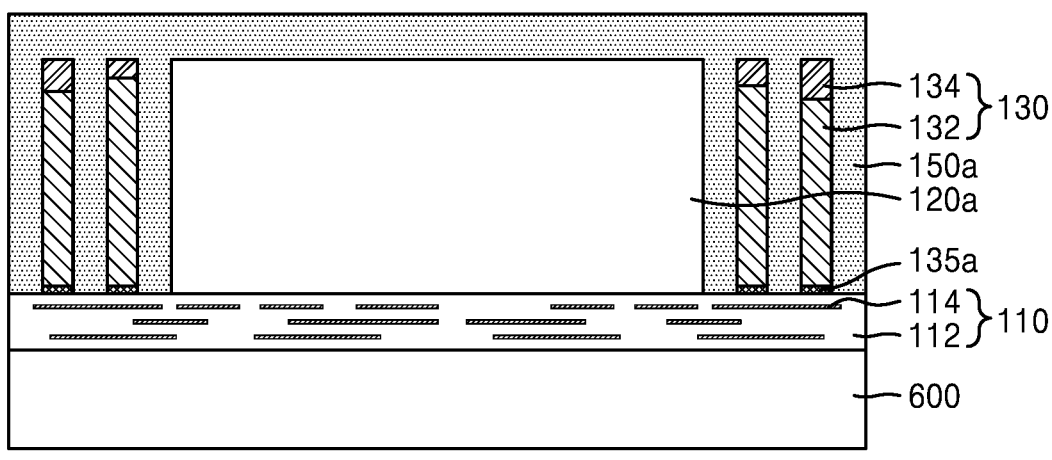

Referring to FIG. 8B, after the first semiconductor chip 120a is mounted, a sealing member 150a covering the first semiconductor chip 120a and the through posts 130 is formed on the first redistribution substrate 110. The sealing member 150a may cover side surfaces and top surfaces of the first semiconductor chip 120a and the through posts 130. For example, the sealing member 150a may contact side surfaces and top surfaces of the first semiconductor chip and the through posts 130.

Figure 8C:
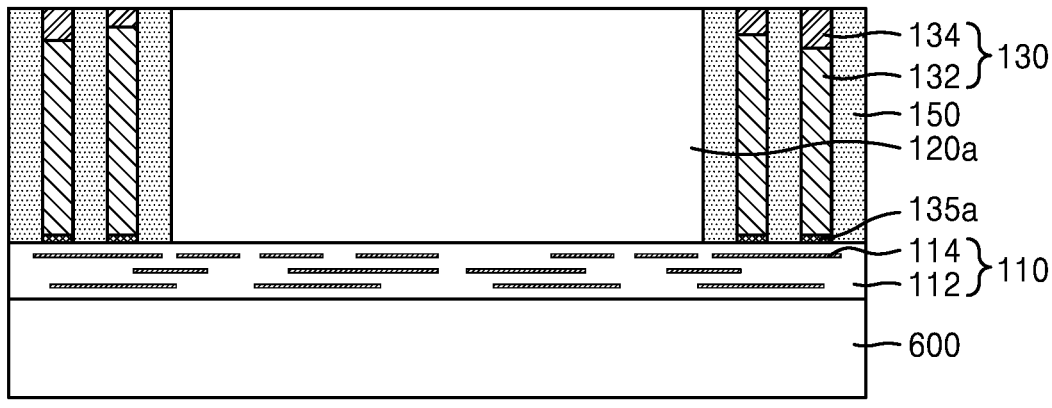

Referring to FIG. 8C, thereafter, a planarization process of removing an upper portion of the sealing member 150a is performed. The planarization process may be performed, for example, through CMP. The top surfaces of the through posts 130 may be exposed from the sealing member 150 through the planarization process. For example, after the planarization process, the top surfaces of the through posts 130 and the top surface of the sealing member 150 may be substantially coplanar.

In this example, the top surface of the first semiconductor chip 120a is the active surface ACT, and thus, after the planarization process, the top surface of the first semiconductor chip 120a may not be exposed, and the sealing member 150a having a small thickness may be present on the top surface of the first semiconductor chip 120a. However, according to some embodiments, the top surface of the first semiconductor chip 120a may be exposed after the planarization process.

In the present embodiment, the top surface of the through post 130 may be the top surface of the upper metal layer 134 including Ni. Therefore, contamination of the first semiconductor chip 120a due to diffusion of Cu into silicon may not occur during the planarization process. As a result, even when the top surface of the first semiconductor chip 120 is exposed during the planarization process, there may be no problem. For example, there may be no diffusion problem in the first semiconductor chip 120a.

Figure 8D:
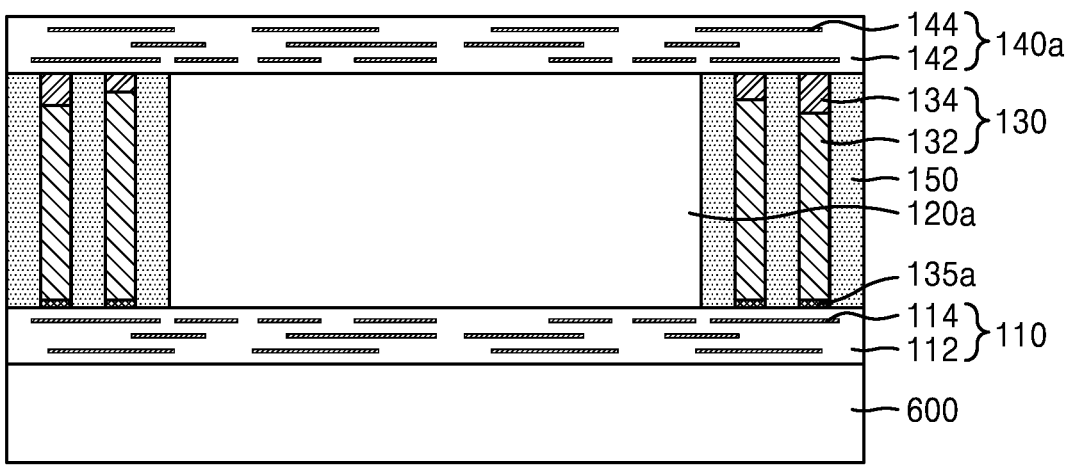

Referring to FIG. 8D, the second redistribution substrate 140a is formed on the first semiconductor chip 120a, the through posts 130, and the sealing member 150. As described above with reference to FIGS. 4A and 4B, the second redistribution lines 144 of the second redistribution substrate 140a may be connected to the chip pads 122 of the first semiconductor chip 120a through the second contact vias 148.

Subsequently, by arranging the first external connection terminals 160 on the top surface of the second redistribution substrate 140a and separating the carrier substrate 600, the semiconductor package 100b of FIG. 4A may be completed. In certain embodiments, the processes of FIGS. 8A to 8D may be performed at the wafer level, and the semiconductor package 100b of FIG. 4A may be completed through a singulation process. Furthermore, a structure obtained by arranging the first external connection terminals 160 and separating the carrier substrate 600 in the structure of FIG. 8D and turning a result structure upside down may correspond to the semiconductor package 100b of FIG. 4A.

FIGS. 9A to 9D are cross-sectional views schematically showing a process/method of manufacturing a semiconductor package of FIG. 5. Descriptions of embodiments illustrated in FIGS. 9A to 9D will be given below with reference to FIG. 5, and descriptions already given above with reference to FIGS. 7A to 7L will be briefly given or omitted in the following descriptions for brevity.

Figure 9A:
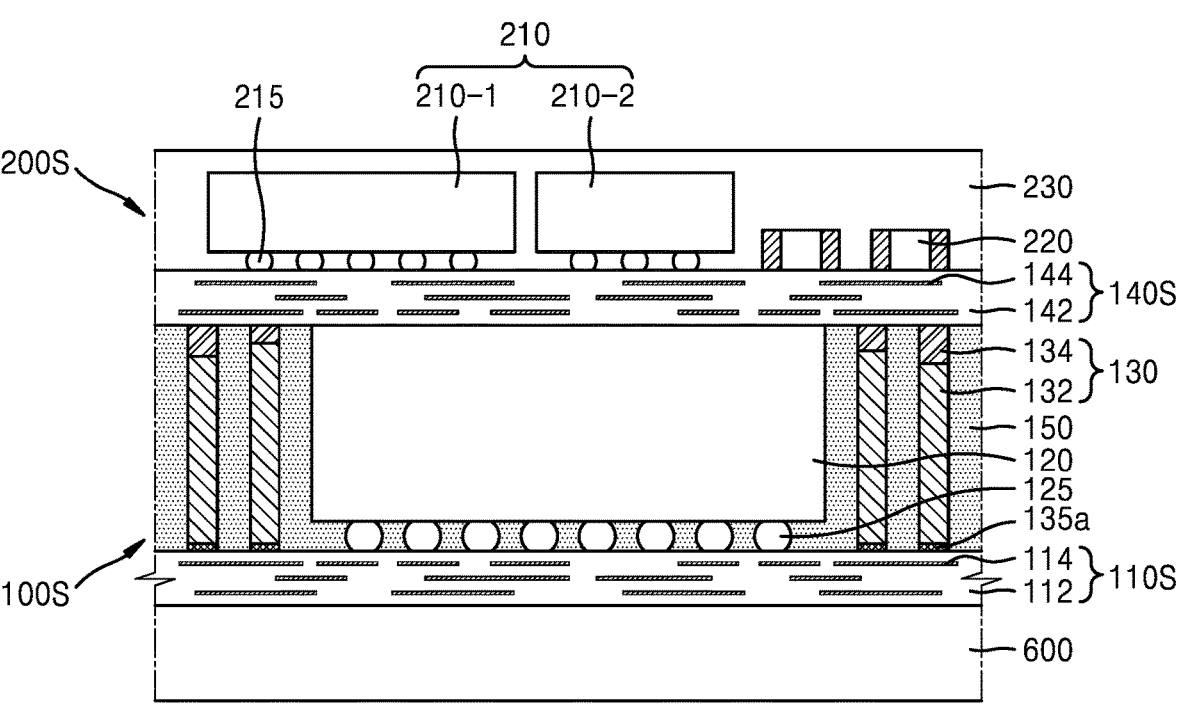
FIGS. 9A to 9D are cross-sectional views schematically showing a process of manufacturing the semiconductor package of FIG. 5.

Referring to FIG. 9A, in the method of manufacturing a semiconductor package according to the present embodiment, the second redistribution substrate 140 is formed through the processes of FIGS. 7A to 7L. Thereafter, the upper package 200 is formed on the second redistribution substrate 140. The structure of the upper package 200 is the same as that described above with reference to FIG. 5.

Figure 9B:
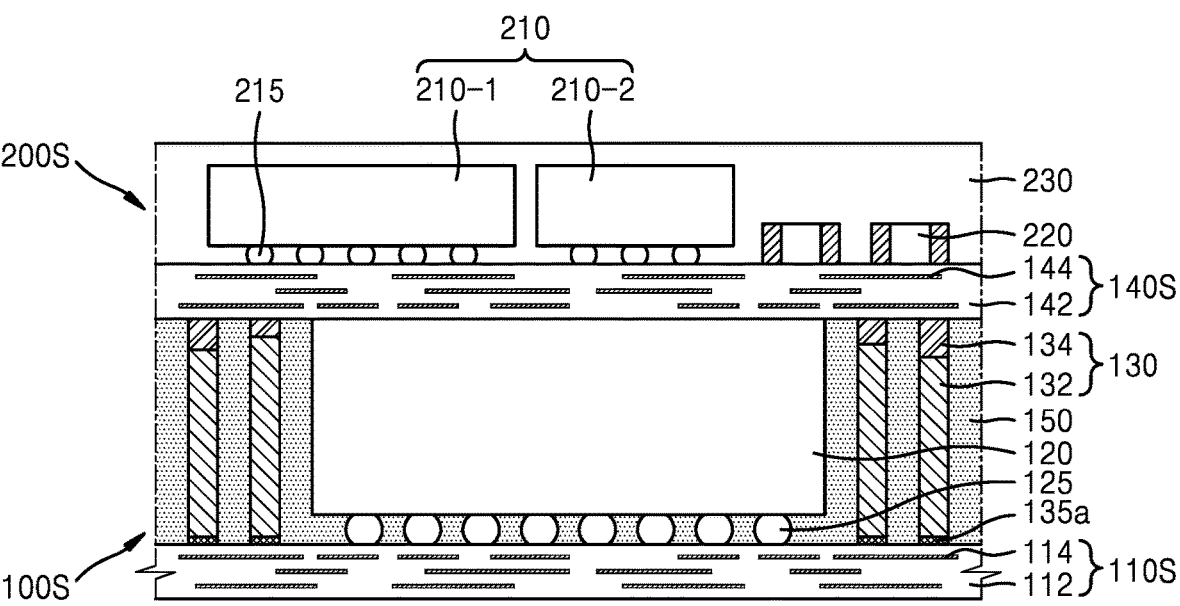
Figure 9C:
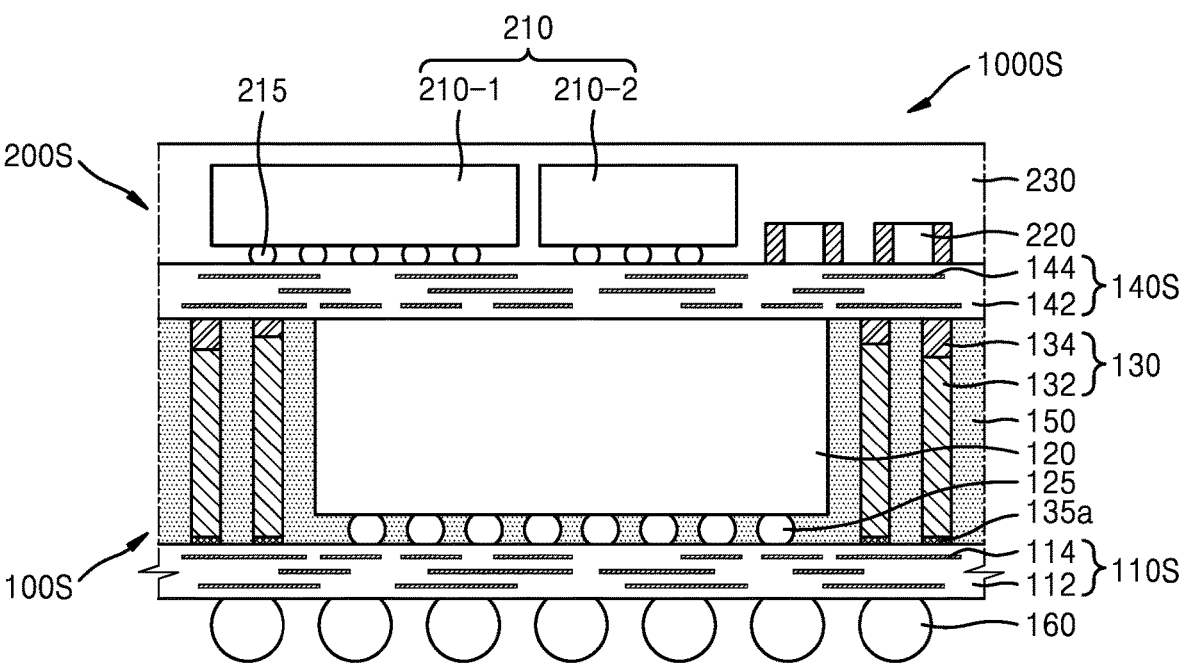
Figure 9D:
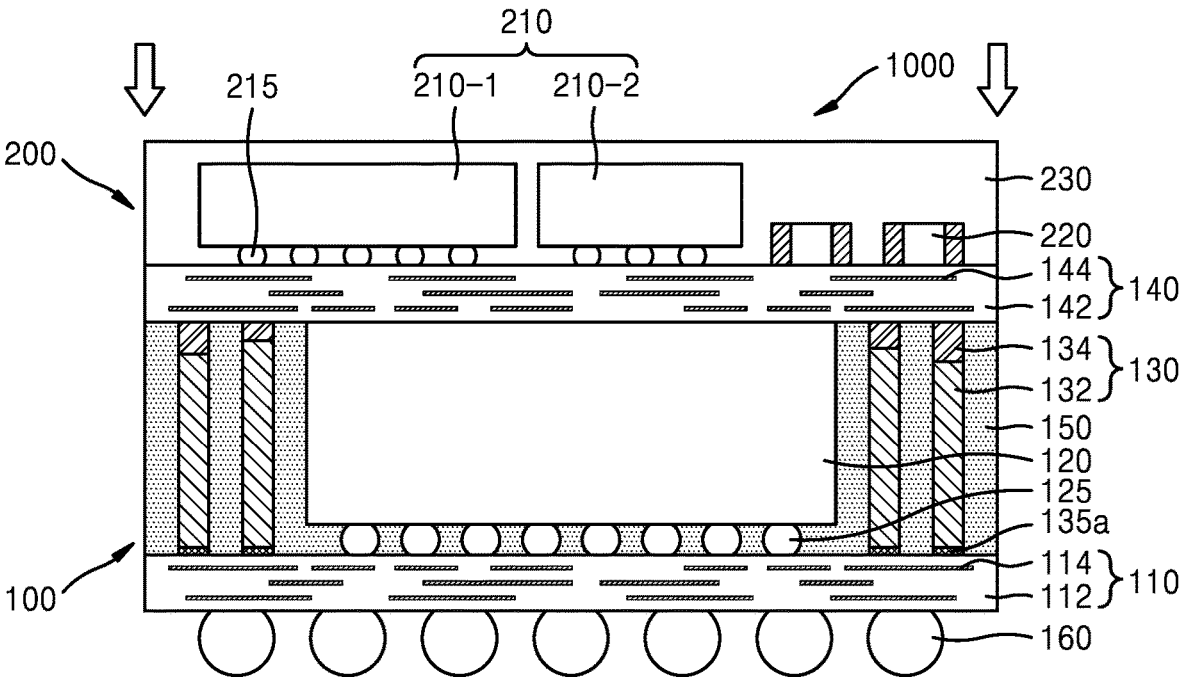

To illustrate a singulation process of FIG. 9D, in FIGS. 9A to 9C, the first redistribution substrate 110 is shown in the form of an original first redistribution substrate 110S by dash-single dotted lines instead of one first redistribution substrate 110. Also, the second redistribution substrate 140 is shown in the form of an original second redistribution substrate 140S by dash-single dotted lines. Furthermore, the semiconductor package 100 and the upper package 200 are also shown as an original semiconductor package 100S' and an original upper package 200S by dash-single dotted lines. Also, since the first external connection terminals 160 are not yet arranged in the original semiconductor package 100S', the structure of the original semiconductor package 100S' may be different from that of the actual semiconductor package 100.

Referring to FIG. 9B, after the original upper package 200S is formed, the carrier substrate 600 is removed from the original first redistribution substrate 110S. The bottom surface of the original first redistribution substrate 110S may be exposed by removing the carrier substrate 600.

Subsequently, referring to FIG. 9C, the first external connection terminals 160 are arranged on the bottom surface of the original first redistribution substrate 110S. The first external connection terminals 160 may be arranged on the bottom surface of the original first redistribution substrate 110S in an FO structure. The FO structure is the same as that described in the description of the semiconductor package 100 of FIG. 1. By arranging the first external connection terminals 160, an original package semiconductor 1000S corresponding to the semiconductor package 1000 of FIG. 5 may be formed.

Referring to FIG. 9D, thereafter, as indicated by a thick arrow, the original package semiconductor 1000S is individualized through a singulation process. Through the individualization, the semiconductor package 1000 of FIG. 5 may be completed.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be interchangeably combined with components and/or features of other embodiments unless the context indicates otherwise.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first redistribution substrate;
a first semiconductor chip on the first redistribution substrate, the first semiconductor chip including an integrated circuit;
a plurality of through posts arranged on the first redistribution substrate, around the first semiconductor chip, each of the plurality of through posts being comprised of at least two metal layers arranged in a vertical direction with respect to each other; and
a second redistribution substrate located over the first semiconductor chip and the plurality of through posts, the second redistribution substrate including first contact vias and second contact vias, which are exposed on a bottom surface of the second redistribution substrate, wherein a top surface of the first semiconductor chip is in contact with the bottom surface of the second redistribution substrate,
wherein the plurality of through posts electrically connect the first redistribution substrate and the second redistribution substrate to each other,
wherein the first contact vias are in contact with top surfaces of the plurality of through posts and are electrically connected to the integrated circuit through the plurality of through posts and the first redistribution substrate, and
wherein the second contact vias are in direct physical contact with the top surface of the first semiconductor chip and are electrically insulated from the integrated circuit.

2. The semiconductor package of claim 1, wherein the at least two metal layers comprise a lower copper (Cu) metal layer and an upper nickel (Ni) metal layer.

3. The semiconductor package of claim 1, wherein the at least two metal layers comprise an upper metal layer and a lower metal layer,
upper metal layers of at least two of the plurality of through posts have different thicknesses from each other.

4. The semiconductor package of claim 1, further comprising a sealing member located between the first redistribution substrate and the second redistribution substrate and sealing the first semiconductor chip,
wherein the plurality of through posts extend through the sealing member.

5. The semiconductor package of claim 1, further comprising external connection terminals arranged on a bottom surface of the first redistribution substrate in a fan-out (FO) structure.

6. The semiconductor package of claim 1, wherein the first semiconductor chip comprises a logic semiconductor chip comprising logic devices.

7. The semiconductor package of claim 1, further comprising at least one second semiconductor chip on the second redistribution substrate.

8. The semiconductor package of claim 1, further comprising a high-bandwidth memory (HBM) package arranged on the first redistribution substrate and adjacent to the first semiconductor chip.

9. A semiconductor package comprising:
a first redistribution substrate;
a semiconductor chip on the first redistribution substrate, the semiconductor chip including an integrated circuit;
a plurality of through posts on the first redistribution substrate, around the semiconductor chip;
a second redistribution substrate located over the semiconductor chip and the plurality of through posts, the second redistribution substrate including first contact vias and second contact vias, which are exposed on a bottom surface of the second redistribution substrate;
a sealing member located between the first redistribution substrate and the second redistribution substrate and sealing the semiconductor chip; and
external connection terminals arranged in a fan-out (FO) structure on a bottom surface of the first redistribution substrate,
wherein a top surface of the semiconductor chip is in contact with the bottom surface of the second redistribution substrate,
wherein the plurality of through posts each comprise at least two metal layers arranged in a vertical direction with respect to each other, wherein the first contact vias are in contact with top surfaces of the plurality of through posts and are electrically connected to the integrated circuit through the plurality of through posts and the first redistribution substrate, and wherein the second contact vias are in direct physical contact with the top surface of the semiconductor chip and are electrically insulated from the integrated circuit.

10. The semiconductor package of claim 9, wherein the at least two metal layers comprise a lower copper (Cu) metal layer and an upper nickel (Ni) metal layer, and Ni metal layers of at least two of the plurality of through posts have different thicknesses from each other.

11. A semiconductor package comprising:

a first redistribution substrate;

a first semiconductor chip on the first redistribution substrate, the first semiconductor chip including an integrated circuit;

a plurality of through posts arranged on the first redistribution substrate, around the first semiconductor chip, each of the plurality of through posts being comprised of at least two metal layers arranged in a vertical direction with respect to each other;

a second redistribution substrate located over the first semiconductor chip and the plurality of through posts, the second redistribution substrate including first contact vias and second contact vias, which are exposed on a bottom surface of the second redistribution substrate;

at least one second semiconductor chip on the second redistribution substrate; and external connection terminals arranged in a fan-out (FO) structure on a bottom surface of the first redistribution substrate, wherein a top surface of the first semiconductor chip is in contact with a bottom surface of the second redistribution substrate, wherein the plurality of through posts electrically connect the first redistribution substrate and the second redistribution substrate to each other, wherein the first contact vias are in contact with top surfaces of the plurality of through posts and are electrically connected to the integrated circuit through the plurality of through posts and the first redistribution substrate, and wherein the second contact vias are in direct physical contact with the top surface of the first semiconductor chip and are electrically insulated from the integrated circuit.

12. The semiconductor package of claim 11, wherein the first semiconductor chip comprises a logic semiconductor chip, and the at least one second semiconductor chip comprises a memory semiconductor chip comprising memory devices.

13. The semiconductor package of claim 11, further comprising at least one passive device on the second redistribution substrate.

14. The semiconductor package of claim 11, further comprising:

a first sealing member located between the first redistribution substrate and the second redistribution substrate and sealing the first semiconductor chip; and a second sealing member sealing the at least one second semiconductor chip, wherein the plurality of through posts extend through the first sealing member.

15. The semiconductor package of claim 1, wherein the second redistribution substrate includes redistribution lines extending in a horizontal direction, and wherein the redistribution lines, the second contact vias, and the first semiconductor chip overlap in the vertical direction.

16. The semiconductor package of claim 15, wherein a plurality of redistribution lines are formed in different layers of the second redistribution substrate.

* * * * *